United States Patent
Ishikawa et al.

(10) Patent No.: US 7,157,319 B2
(45) Date of Patent: Jan. 2, 2007

(54) METHOD OF PATTERNING A THIN FILM TRANSISTOR THAT INCLUDES SIMULTANEOUSLY FORMING A GATE ELECTRODE AND A PIXEL ELECTRODE

(75) Inventors: Yoshimitsu Ishikawa, Kumamoto (JP); Takehisa Yamaguchi, Kumamoto (JP); Ken Nakashima, Kumamoto (JP)

(73) Assignee: Advanced Display Inc., Kumamoto (JP)

( * ) Notice: Subject to any disclaimer, the term of this patent is extended or adjusted under 35 U.S.C. 154(b) by 0 days.

(21) Appl. No.: 10/381,865

(22) PCT Filed: Jul. 5, 2001

(86) PCT No.: PCT/JP01/05827

§ 371 (c)(1),
(2), (4) Date: Mar. 28, 2003

(87) PCT Pub. No.: WO02/37574

PCT Pub. Date: May 10, 2002

(65) Prior Publication Data

US 2004/0089900 A1    May 13, 2004

(30) Foreign Application Priority Data

Nov. 6, 2000    (JP)    ............................... 2000338106

(51) Int. Cl.
*H01L 21/00* (2006.01)

(52) U.S. Cl. ............... 438/158; 438/949; 257/E21.026; 257/E21.414; 430/5

(58) Field of Classification Search ................ 438/942, 438/947–949, 158; 216/41, 49, 54; 430/5; 257/E21.026, E21.414
See application file for complete search history.

(56) References Cited

U.S. PATENT DOCUMENTS

| | | | | |
|---|---|---|---|---|
| 4,231,811 A | * | 11/1980 | Somekh et al. | ............. 438/301 |
| 4,778,773 A | * | 10/1988 | Sukegawa | .................... 438/160 |
| 5,490,896 A | * | 2/1996 | Yagi et al. | ................ 156/345.3 |
| 5,556,726 A | * | 9/1996 | Yuan | ............................ 430/30 |
| 5,604,059 A | * | 2/1997 | Imura et al. | .................... 430/5 |
| 5,620,818 A | * | 4/1997 | Yuan | .............................. 430/5 |
| 5,622,633 A | * | 4/1997 | Ohtsuka et al. | ............... 438/53 |
| 5,635,315 A | * | 6/1997 | Mitsui | ............................ 430/5 |

(Continued)

FOREIGN PATENT DOCUMENTS

JP    10-163 174 A    11/1998

(Continued)

OTHER PUBLICATIONS

Patent Abstracts of Japan, English abstract of JP 10-163 174-A, Nishiki et al./Sharp, publ. Jun. 19, 1998, on basis of JP application 08-318 396 filed Nov. 29, 1996.

(Continued)

*Primary Examiner*—Lynne A. Gurley
*Assistant Examiner*—Stanetta Isaac
(74) *Attorney, Agent, or Firm*—Ware, Fressola, Van Der Sluys & Adolphson LLP

(57) ABSTRACT

A high-precision patterning is conducted with a half-tone resist thickness being prevented from varying due to the presence/absence of a base film. A transmitting portion and two kinds of semi-transmitting portions, providing different quantities of transmitted light, are provided in a photomask for exposing a resist, and a smaller-transimitting-light-quantity semi-transmitting portion is used in a base film-present area and a large-transmitting light-quantity semi-transmitting portion is used in a base-film-free area to regulate luminous exposure while exposing, thereby forming a half-tone resist having uniform thickness.

4 Claims, 23 Drawing Sheets

U.S. PATENT DOCUMENTS

| | | | |
|---|---|---|---|
| 5,700,606 A * | 12/1997 | Kobayashi et al. | 430/5 |
| 5,723,236 A * | 3/1998 | Inoue et al. | 430/5 |
| 5,780,208 A * | 7/1998 | Ziger et al. | 430/394 |
| 5,786,113 A * | 7/1998 | Hashimoto et al. | 430/5 |
| 5,837,405 A * | 11/1998 | Tomofuji et al. | 430/5 |
| 5,914,202 A * | 6/1999 | Nguyen et al. | 430/5 |
| 5,935,735 A * | 8/1999 | Okubo et al. | 430/5 |
| 5,955,223 A * | 9/1999 | Mitsui et al. | 430/5 |
| 6,087,678 A * | 7/2000 | Kim | 257/59 |
| 6,103,557 A * | 8/2000 | Nakanishi | 438/158 |
| 6,132,908 A * | 10/2000 | Shiraishi et al. | 430/5 |
| 6,156,583 A * | 12/2000 | Hwang | 438/30 |
| 6,249,335 B1 * | 6/2001 | Hirukawa et al. | 355/53 |
| 6,255,130 B1 * | 7/2001 | Kim | 438/30 |
| 6,287,899 B1 * | 9/2001 | Park et al. | 438/149 |
| 6,335,148 B1 * | 1/2002 | Lee et al. | 430/316 |
| 6,337,284 B1 * | 1/2002 | Hwang et al. | 438/710 |
| 6,383,831 B1 * | 5/2002 | Kim | 438/34 |
| 6,399,454 B1 * | 6/2002 | Yamazaki | 438/308 |
| 6,410,211 B1 * | 6/2002 | Bae | 430/318 |
| 6,426,131 B1 * | 7/2002 | Jackson et al. | 428/131 |
| 6,541,167 B1 * | 4/2003 | Petersen et al. | 430/5 |
| 6,551,750 B1 * | 4/2003 | Pierrat | 430/5 |
| 6,653,028 B1 * | 11/2003 | Lee et al. | 430/5 |
| 6,700,649 B1 * | 3/2004 | Chandhok et al. | 355/77 |
| 6,876,428 B1 * | 4/2005 | Kwak et al. | 349/187 |
| 2001/0049064 A1 * | 12/2001 | Lee et al. | 430/5 |
| 2002/0001777 A1 * | 1/2002 | Kido | 430/313 |
| 2002/0033927 A1 * | 3/2002 | Mun et al. | 349/156 |
| 2005/0158926 A1 * | 7/2005 | Kim | 438/151 |

FOREIGN PATENT DOCUMENTS

JP    11-307 780 A    11/1999

OTHER PUBLICATIONS

Patent Abstracts of Japan, English abstract of JP 11-307 780-A, KIDO/NEC Kagoshima Ltd., publ. Nov. 5, 1999, on basis of JP application 10-116 918 filed Apr. 27, 1998.

* cited by examiner

FIG. 15(a)
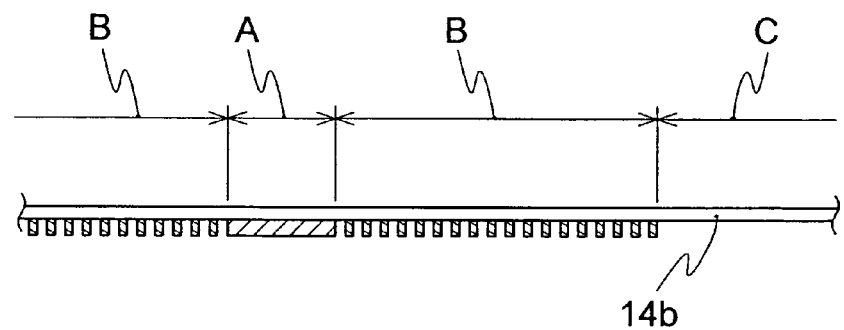
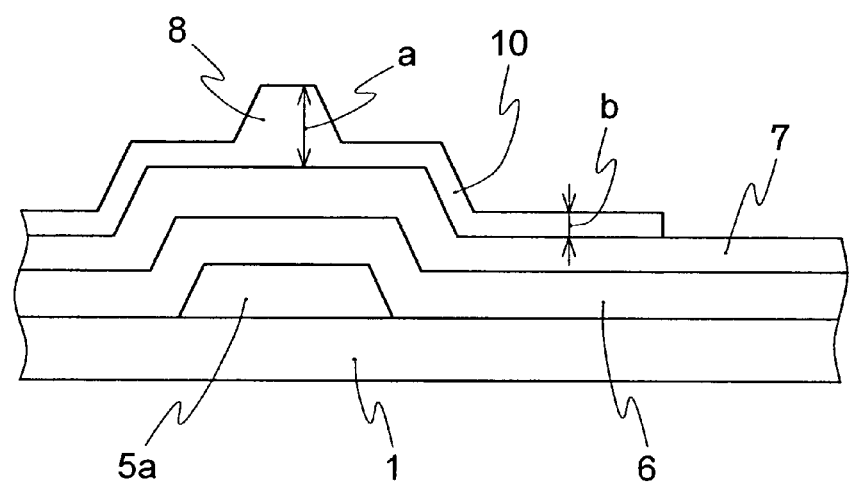
FIG. 15(b)
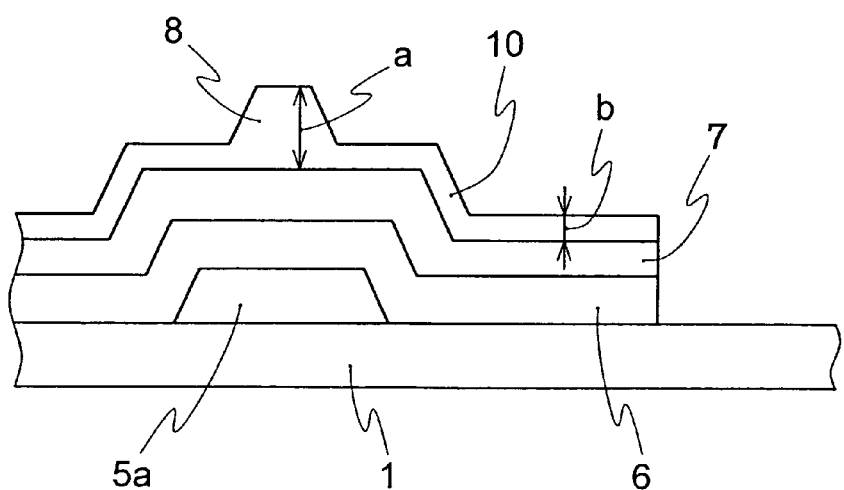

METHOD OF PATTERNING A THIN FILM TRANSISTOR THAT INCLUDES SIMULTANEOUSLY FORMING A GATE ELECTRODE AND A PIXEL ELECTRODE

TECHNICAL FIELD

The present invention relates to a method of patterning a thin film such as a conductor, a semiconductor, an insulator or the like, and more particularly to a method of patterning various thin films constituting an active matrix type liquid crystal display element (hereinafter referred to as an "AMLCD") using a thin film transistor (hereinafter referred to as a "TFT"), and more specifically to a TFT array substrate of the AMLCD and a manufacturing method thereof.

BACKGROUND ART

Conventionally, it is always necessary to repeat a photolithographic step five to six times when manufacturing a TFT array substrate and a manufacturing step is prolonged. In particular, an exposing step having a high production equipment cost is required to be used very often so that the cost of the TFT array substrate to be manufactured is necessarily increased. For this reason, a decrease in the photolithographic step can produce a great advantage of cost reduction in order to manufacture the TFT array substrate.

The photolithographic step will be described with reference to FIG. 20.

A film to be etched 2 comprising a conductor, a semiconductor, an insulator or the like is formed on a substrate 1. The photolithographic step is carried out to remove an unnecessary portion of the film to be etched 2, thereby forming a predetermined pattern. As shown in FIG. 20(*a*), first of all, the film to be etched 2 is covered with a resist 3. As shown in FIG. 20(*b*), next, a photomask 4 is used to illuminate light L, thereby carrying out exposure. The photomask 4 has a shielding portion A for shielding the exposure light and a transmitting portion C for transmitting the exposure light. When development is carried out after the exposure, the resist 3 in a portion illuminated by the exposure light is lost and the resist 3 in a portion which is not illuminated by the exposure light remains on the film to be etched 2.

Subsequently, when the film to be etched 2 is removed by etching, the film to be etched 2 in the portion in which the resist 3 remains is left without being subject to the etching (FIG. 20(*c*)). When the resist 3 is finally removed, the etched film 2 having a predetermined pattern is obtained (FIG. 20(*d*)).

The photomask 4 to be used in conventional photolithography is made binary into a portion through which almost 100% of exposure light is transmitted (the transmitting portion C) and a portion through which almost 0% of exposure light is transmitted (the shielding portion A for shielding the exposure light). When the exposure and the development are carried out by using the binary photomask, a portion in which the resist 3 is present and a portion in which the resist 3 is not present are obtained as shown in FIG. 20(*b*). Also in the case in which the amount of exposure light is adjusted depending on a position on the substrate to form a portion in which the resist is thick and a portion in which the resist is thin, the photomask 4 itself is made binary.

Since the etching is carried out by using the binary resist 3 as a mask, the film to be etched 2 can be patterned to have only one kind of pattern at one photolithographic step (FIG. 20(*d*)). Accordingly, in the case in which two or more layers of the films to be etched are provided and each layer is to be patterned to have a separate pattern, the photolithographic step is required to be carried out the same number of times as the number of the layers of the film to be etched.

If the film to be etched having two layers can be patterned so as to have each separate pattern by one-time exposure and development in place of the usual patterning of one layer of a film to be etched at one photolithographic step, that is, one-time exposure and development, one photolithographic step can be reduced. A method to implement the reduction has been disclosed in the specification of Japanese Unexamined Patent Publication No. Hei 10-163174. In addition to the portion (transmitting portion) through which almost 100% of exposure light is transmitted and the portion (shielding portion) through which almost 0% of exposure light is transmitted, the photomask is provided with a portion in which the amount of transmission of the exposure light has an intermediate value therebetween. Consequently, the resist is developed to have two different thicknesses and is removed by ashing, and at the same time, the film to be etched is subjected to dry etching. Thus, two films to be etched which are formed of different materials or having different thicknesses are patterned by carrying out etching at one time, thereby reducing the number of photolithographic steps.

In the following description, a portion on a photomask through which the partial exposure light is transmitted other than the portion (transmitting portion) through which almost 100% of exposed light is transmitted and the portion (shielding portion) in which 0% of exposed light is transmitted will be referred to as "a halftone portion (or a partially transparent portion)", exposure using the halftone portion will be referred to as "halftone exposure" and a portion of the resist which is subjected to the halftone exposure will be referred to as "a half tone resist".

DISCLOSURE OF INVENTION

At a conventional photolithographic step in which the halftone exposure is not used, if only the presence of a resist is controlled, patterning can be carried out with high precision by subsequent etching. On the other hand, in the case in which the halftone exposure is used, the thickness of the halftone resist in the portion (halftone portion) which is illuminated in an intermediate amount of light should be controlled to be constant in order to obtain a desirable pattern. In the conventional method, however, the thickness of the halftone resist is varied for the following factors.

The factor of a difference in the thickness of the halftone resist includes (1) a factor of a device in an exposing machine, that is, the in-plane distribution of an exposure intensity, (2) a factor of a process, that is, the in-plane distribution of the initial thickness of a resist applied by spin coating, and (3) a structural factor causing a thickness difference in the resist resulted from the presence or absence of a layer (hereinafter referred to as an "under layer") lying under the film to be etched and making a rising step in the same which are subjected to the patterning by the halftone exposure.

In particular, a difference in the thickness of the halftone resist which is made by a structural factor to be the presence of the under layer in (3) is influenced more greatly as compared with the factor of a device in (1) and the factor of a process in (2), because the difference in the thickness of the resist follows exactly a thickness of the under layer, in case where the under layer has a thickness of 100 nm to 500 nm.

With reference to FIGS. 21, 22 and 23, description will be given on the reason for which the thickness of the halftone resist in the portion (halftone portion) which is illuminated in a partial amount of light should be controlled to be constant in order to obtain a desirable pattern when using the halftone exposure.

In FIGS. 21, 22 and 23, the reference numeral 1 denotes a substrate, the reference numeral 5 denotes an under layer, the reference numeral 6 denotes a first film to be etched, the reference numeral 7 denotes a second film to be etched and the reference numeral 8 denotes a resist.

As shown in FIG. 21, the substrate film 5, the first film to be etched 6 and the second film 7 to be etched are formed on the substrate 1. In order to carry out patterning over the films to be etched 6 and 7 by photolithography, the resist 8 is applied. Since the resist 8 is applied by a spin coating method, a top surface thereof is almost flat. On the other hand, since the under layer 5 is partially present, the top surface of the film to be etched 7 has concavo-convex portions. Accordingly, the thickness of the applied resist 8 is small in a portion in which the under layer 5 is present, and is large in a portion in which the under layer 5 is not present.

At the photolithographic step, first of all, the resist 8 is exposed by using a photomask (not shown), and furthermore, is developed. The resist 8 placed in a position corresponding to the transmitting portion C of the photomask is exposed and removed by the development. Since the resist 8 placed in a position corresponding to the shielding portion A of the photomask is not exposed, it remains as it is. Since the resist 8 placed in a position corresponding to a partially transparent portion B of the photomask is exposed in an intermediate amount of exposure light, it remains with the thickness reduced (FIG. 22(a)). At this time, the amount of the decrease in the thickness of the resist 8 is proportional to the amount of exposure.

The amount of exposure light is constant over the whole region of the partially transparent portion B. On the other hand, the original thickness of the resist has a difference by the presence of the under layer 5. As a result, there are formed a portion 8a in which the resist is thin and a portion 8b in which the resist is thick.

By using the resist 8, the first film to be etched 6 and the second film to be etched 7 are subjected to patterning. The first film to be etched 6 and the second film to be etched 7 in a portion in which the resist 8 is removed (a portion corresponding to the transparent portion C) are removed (FIG. 22(b)).

Next, the halftone resists 8a and 8b in the portions corresponding to the partially transparent portion B are removed and the second film to be etched 7 in this portion is then etched to obtain a predetermined pattern.

As described above, however, the thicknesses of the halftone resists 8a and 8b are different from each other by the thickness of the under layer 5. If, based on the portion 8a in which the halftone resist is thin, ashing is carried out so as to completely remove the resist in the portion 8a, the resist of the portion 8b in which the halftone resist is thick remains partially so that a residual pattern 8b' is caused to generate the defects of the TFT array substrate (FIG. 23(b)). On the other hand, in the case in which the ashing is carried out based on the portion 8b in which the halftone resist is thick, the halftone resists 8a and 8b are completely removed but side etching 9 is also carried out over the resist 8 in a portion corresponding to the shielding portion A so that the dimension of the remaining resist 8 is reduced as shown in FIG. 23(a).

In the case in which a difference in the thickness of the resist which is made by the presence of the under layer is generally several hundreds nm and the halftone resist is completely peeled by the ashing, that is, the case in which the portion 8b in which the halftone resist is thick is completely removed, the amount of the side etching 9 is several μm. Accordingly, when patterning is to be carried out, the amount of the side etching of the resist is to be grasped accurately.

However, the shape and thickness of the substrate film are actually varied. Moreover, the factors other than the under layer also influence the amount of the side etching. Therefore, it is hard to accurately grasp the amount of the side etching in each position on the substrate. Accordingly, even if the photomask is designed in consideration of the side etching by the presence of the substrate film, precision in the patterning is not enhanced.

Therefore, it is effective that the thickness of the resist is to be constant irrespective of the presence of the under layer in order to carry out the halftone exposure to obtain a desirable pattern, and it is impossible to control the patterning with high precision to obtain a desirable pattern by an exposing method using a conventional halftone mask which does not consider the structural factor of the TFT array substrate in which the presence of the under layer is inevitably varied.

The present invention has an object to enhance the productivity of an AMLCD or to reduce a cost and provides a patterning method in which the number of photolithographic steps (the number of masks) required for manufacturing the TFT array substrate is decreased and a halftone resist portion is caused to have a uniform thickness irrespective of the presence of the under layer so that a desirable pattern can be obtained with high precision.

In order to solve the above-mentioned problems, the present invention provides a thin film patterning method comprising a step of forming a pattern of an under layer on a substrate, a step of forming two or more (at least two) films, a step of applying a resist on the etched films, a step of exposing the resist by using a photomask having a transparent portion, a shielding portion and at least two partially transparent portions through which light is transmitted in different amounts, a step of developing the resist thus exposed to obtain at least three kinds of regions, that is, a region in which the resist has a thickness of almost 0 (zero), a region in which the resist has a large thickness, and a region in which the resist has an intermediate thickness, and a step of etching the films while carrying out ashing over the resist wherein, in the region in which the resist has the intermediate thickness, an amount of light transmission during the exposure in the region in which the under layer is present is smaller than an amount of light transmission during the exposure in the region in which the under layer is not present.

Moreover, a thin film patterning method comprises a step of forming a pattern of a shielding under layer on a transparent substrate, a step of forming two or more films on the transparent substrate and the shielding under layer, a step of applying a resist on the etched films, a first exposing step of exposing the resist from a surface of the transparent substrate which is not coated with the resist, a second exposing step of exposing the resist by using a photomask having a transparent portion, a shielding portion and a partially transparent portion, a step of developing the resist after the second exposing step to obtain at least three kinds of regions, that is, a region in which the resist has a thickness of almost 0 (zero), a region in which the resist has a large thickness, and a region in which the resist has an intermediate thickness, and a step of etching the film to be etched while carrying out ashing over the resist, wherein an amount of light irradiation at the first exposing step is equal to an amount of irradiation for exposing the resist with a thickness of the under layer.

Furthermore, a thin film patterning method comprises a step of forming a pattern of an under layer on a substrate, a step of forming two or more films, a step of applying a resist on the etched films, a step of exposing the resist by using a photomask having a transparent portion, a shielding portion and a partially transparent portion, a step of developing the resist thus exposed to obtain at least three kinds of regions, that is, a region in which the resist has a thickness of almost 0 (zero), a region in which the resist has a large thickness, and a region in which the resist has an intermediate thickness, and a step of etching the film to be etched while carrying out ashing over the resist, wherein a flattened film for absorbing a step generated by the pattern of the under layer is formed before the film to be etched is provided.

Moreover, a TFT array substrate has a transparent conductive layer, a metal layer, a gate insulating film and a semiconductor layer on a substrate, and has a gate electrode/wiring formed of the transparent conductive layer and the metal layer and a pixel electrode formed of the transparent conductive layer, and at least a gate insulating film, a semiconductor layer and a metal layer are removed in a portion provided on the pixel electrode through which light is transmitted, the semiconductor layer being almost flattened by the gate insulating film.

Furthermore, a method of manufacturing a TFT array substrate comprises a step of forming a transparent conductive layer on a substrate, a step of forming a first metal layer on the transparent conductive layer, a step of etching the transparent conductive layer and the metal layer to form a gate electrode/wiring and a pixel electrode, a step of forming a gate insulating film and a semiconductor layer, a step of etching the gate insulating film and the semiconductor layer to expose the pixel electrode, a step of removing a first metal layer of the pixel electrode thus exposed, and a step of forming a second metal layer and carrying out etching to form a source electrode and a drain electrode, wherein the gate insulating film is formed to have such a thickness as to absorb a step provided by the gate electrode/wiring.

Moreover, a method of manufacturing a TFT array substrate comprises a step of forming a transparent conductive layer on a substrate, a step of forming a first metal layer on the transparent conductive layer, a step of etching the transparent conductive layer and the metal layer to form a gate electrode/wiring and a pixel electrode, a step of forming a gate insulating film and a semiconductor layer, a step of applying a resist on the gate insulating film and the semiconductor layer, a step of exposing and developing the resist, thereby forming a region A in which the resist is made thick to leave the semiconductor layer, a region C in which the resist is removed to eliminate the semiconductor layer, the gate insulating film and the first metal layer in at least a portion on the pixel electrode through which light is transmitted, and a region B in which the thickness of the resist is made smaller than that of the resist formed in the region A in order to remove the semiconductor layer, a step of etching the semiconductor layer and the gate insulating film to expose the pixel electrode by using the resist forming the regions A, B and C, a step of removing the first metal layer to be an upper layer of the pixel electrode thus exposed, a step of removing the resist from the region B while leaving the resist in the region A, a step of removing the semiconductor layer in a portion other than the region A, a step of peeling the resist in the region A, and a step of forming a second metal layer and carrying out etching to form a source electrode and a drain electrode, wherein the gate insulating film is formed to have such a thickness as to absorb a step provided by the gate electrode/wiring.

BRIEF DESCRIPTION OF DRAWINGS

FIG. 15 is a sectional view showing the process for manufacturing a TFT array substrate according to the third Embodiment of the present invention.

BEST MODE FOR CARRYING OUT THE INVENTION

First of all, photolithography for a TFT array substrate to be used for an AMLCD will be explained.

A resist is applied, by means of a spin coater, on a film to be etched provided by a method, for example, various CVD methods such as plasma CVD, sputtering, evaporation, a coating method or the like. After a resist is applied, prebaking is carried out at 120° C. for 90 seconds and exposure is then performed by using a photomask. In that case, an exposing machine of a stepper or a mirror projection type is used as an exposing machine and g rays and h rays of a high pressure mercury lamp are used as a light source. Subsequently, development is carried out by using a developing solution and postbaking is then performed at 100° C. to 120° C., thereby volatilizing a solvent in the resist and at the same time enhancing adhesion of the resist to a substrate material. Thereafter, a pattern of an etched film is formed by an etching method or the like.

A photomask according to the present invention has a portion through which light is transmitted (a transparent portion) and a portion through which the light is not transmitted at all (a shielding portion), and furthermore, a portion through which light having an intermediate intensity is transmitted, that is, a portion through which partial transmission is carried out (a partially transparent portion).

Figure 1:
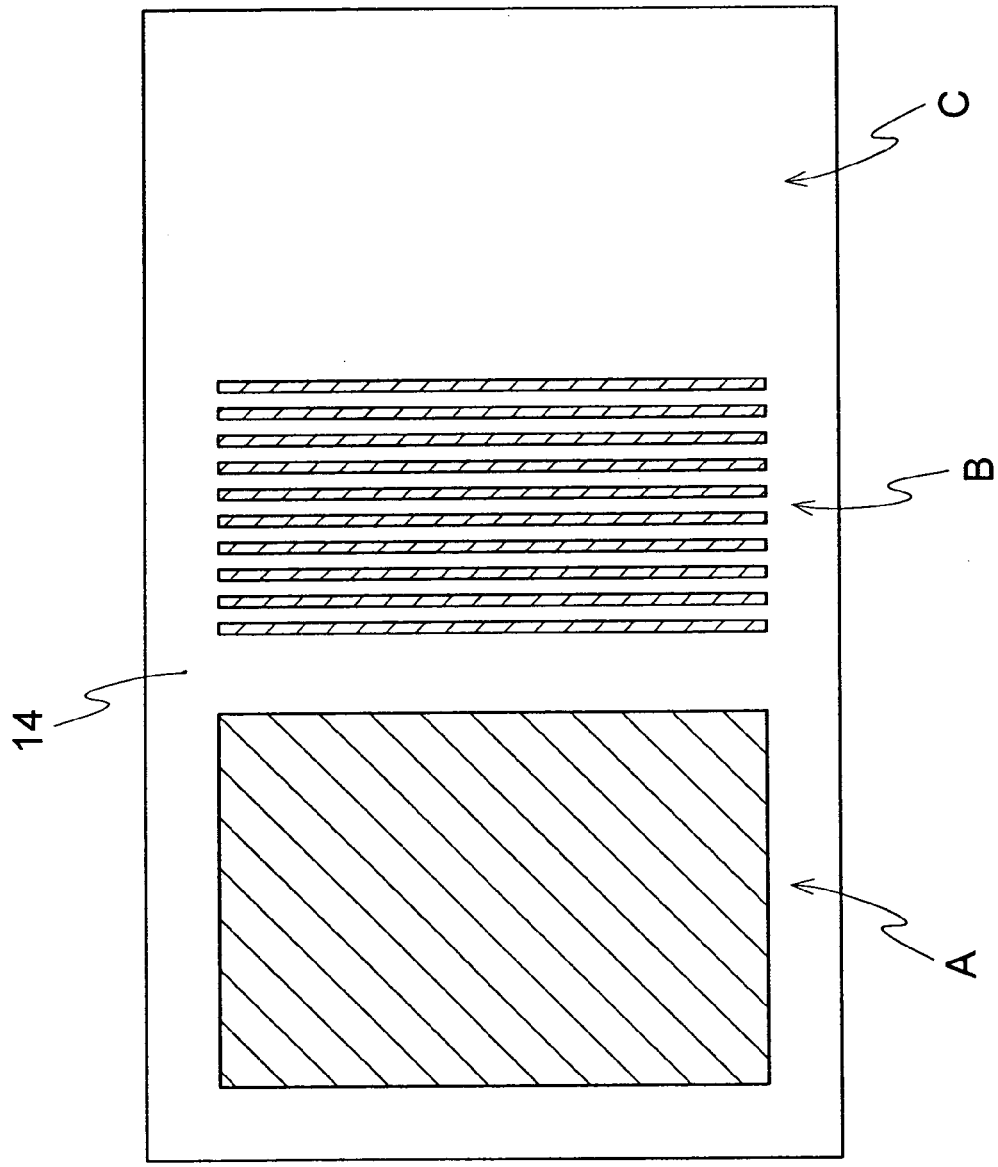
FIG. 1 is a plan view illustrating a photomask for carrying out halftone exposure.

For one method of transmitting the light having an intermediate intensity, as shown in FIG. 1, a large number of finer patterns than the resolution limit value of an exposing device are provided on the transparent substrate of the photomask to form a partially transparent portion B. A shielding portion A of a photomask 14 is a Cr solid mask pattern having a shielding layer such as Cr formed over the whole region on the transparent substrate, and the partially transparent portion B has the shape of a Cr stripe in which a shielding layer such as Cr is provided like a stripe in a region. A width of a Cr layer in the partially transparent portion B (which will be hereinafter referred to as a "line") and a space between adjacent Cr layers (which will be hereinafter referred to as a "space") are set to line/space=1.0 to 2.0 µm/1.0 to 2.0 µm and a pattern is finer than the resolution limit of the exposing device. Therefore, a resist is not exposed like a stripe and the resist in this region is exposed averagely in a smaller amount of exposure (an amount of light irradiation) than an amount of exposure in the transparent portion C.

For example, in the case in which a mask pattern is set to line/space=3.0 µm to 3.0 µm which is greater than the resolution limit value, the resist is exposed like a stripe of line/space=3.0 µm/3.0 µm. In the case in which the mask pattern is set to line/space=2.0 µm/3.0 µm which is smaller than the resolution limit value, the exposure light is completely transmitted. In a portion through which the exposure light is partially transmitted, thus, a pattern is formed with a very fine pattern size which is not resolved by the exposure light.

Figure 2:
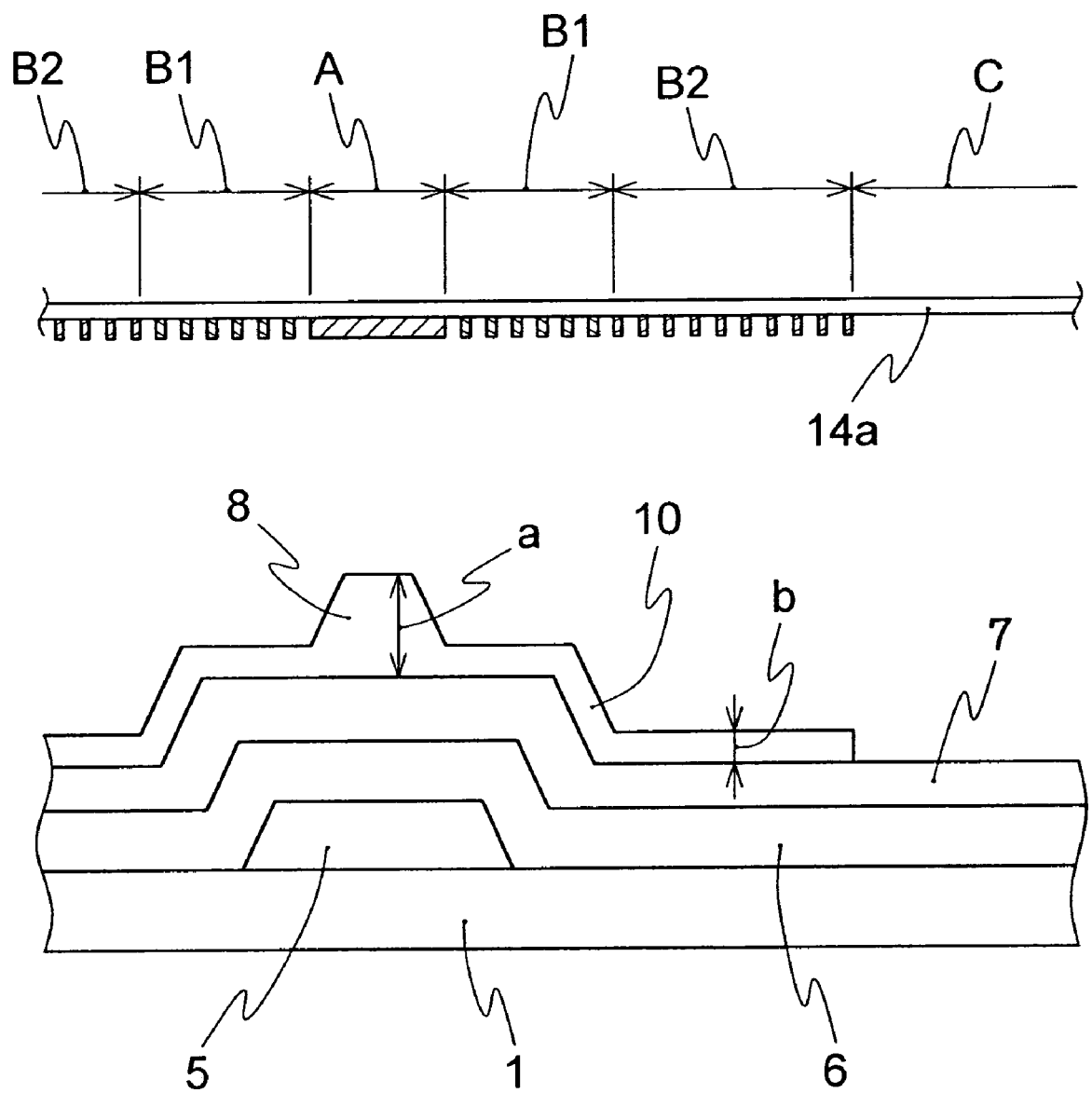
FIG. 2 is a sectional view showing a patterning method according to the present invention.

In the present invention, as shown in FIG. 2, the partially transparent portion B through which light having an partial intensity is transmitted is formed by two kinds of partially transparent portions B1 and B2 having different photomask patterns, such that an amount of light transmitted through the partially transparent portion B2 corresponding to the portion in which the under layer 5 is not present is large and an amount of light transmitted through the partially transparent portion B1 corresponding to the portion in which the under layer 5 is present is small. Thus, the thickness of the halftone resist 10 exposed and developed is set to have a constant thickness of b both in a portion in which a under layer 5 is present and a portion in which the under layer 5 is not present.

The stripe pattern (line/space) of the partially transparent portion is determined by factors including the thickness of the resist obtained immediately after the application (before the exposure and the development), the thickness of the under layer, a film to be first etched in the halftone portion, and the like. Accordingly, it is preferable that the stripe pattern (line/space) of the partially transparent portion should be properly determined in consideration of these factors.

According to the present invention, the thickness of the resist can be made constant irrespective of the presence of the under layer 5. Therefore, the resist 8 obtained after the exposure and the development comprises a pattern having three kinds of thicknesses of a portion having a thickness of a corresponding to the shielding portion A of the photomask, a portion having a thickness of b corresponding to the partially transparent portions B1 and B2 of the photomask, and a portion having a thickness of 0 (zero) corresponding to the transparent portion C of the photomask.

Figure 3A:
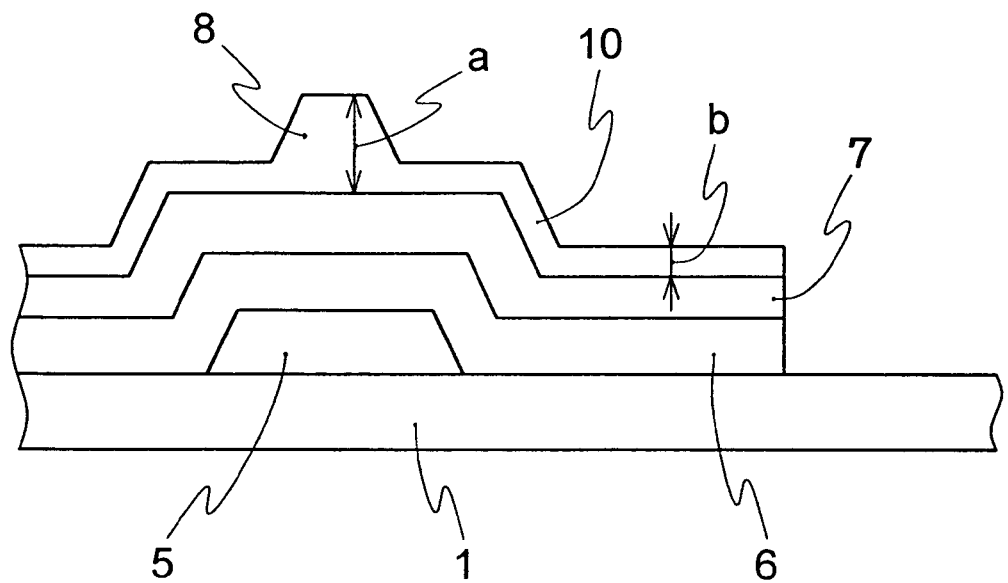
FIG. 3 is a sectional view showing the patterning method according to the present invention.

By using the resist 8, first of all, a first film to be etched 6 and a second film to be etched 7 in a portion in which the resist 8 is not formed (corresponding to the transmitting portion C) are etched (FIG. 3(a)).

Figure 3B:
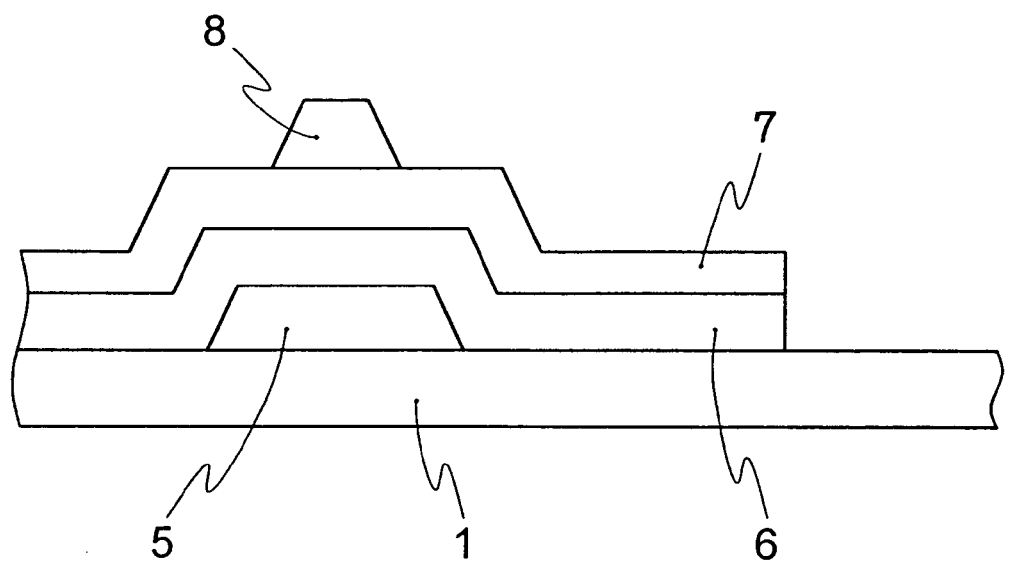

Then, the halftone resist 10 is removed by ashing and only the resist 8 in the portion corresponding to the shielding portion A remains on the film to be etched (FIG. 3(b)).

Figure 4A:
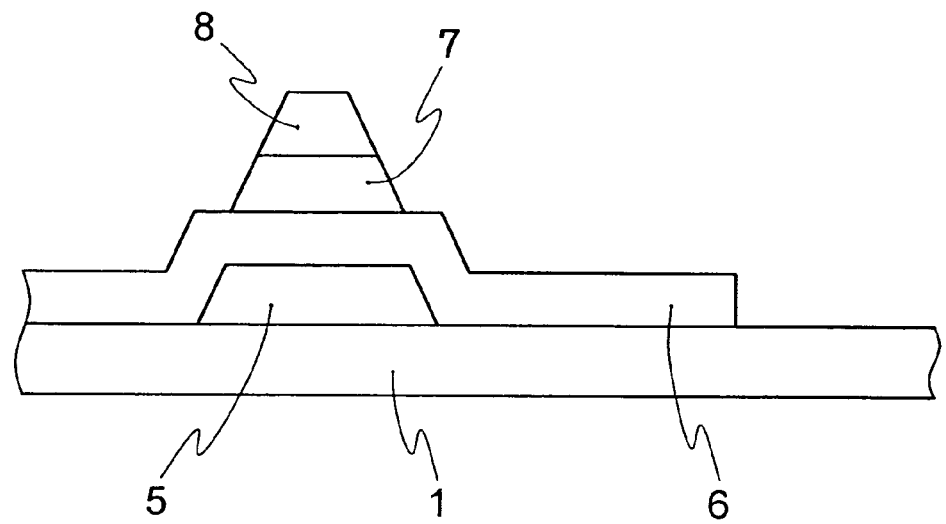
FIG. 4 is a sectional view showing the patterning method according to the present invention.

By using the remaining resist 8, the second film to be etchecd 7 is etched. By one photolithographic step, two layers of the first film 6 and the second film are patterned to have separate patterns, respectively (FIG. 4(a)).

Figure 4B:
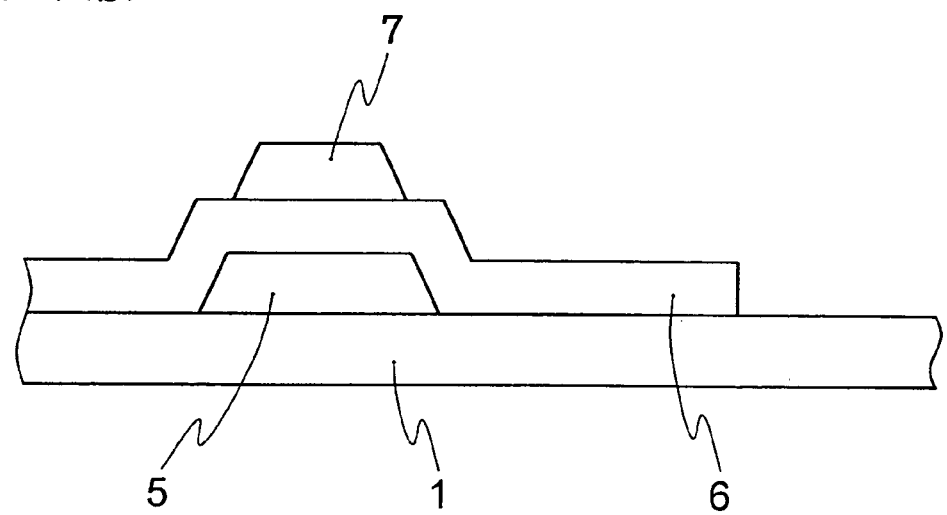

Subsequently, the resist 8 is removed (FIG. 4(b)).

As described above, according to the present invention, the thickness of the halftone resist can be made constant irrespective of the presence of the substrate film and the film to be etched can be patterned with high precision.

In the following, description will be given to Embodiments wherein the present invention is applied to a so-called four-mask process in which a TFT array substrate is to be manufactured at four photolithographic steps.

In this specification, description will be given to a positive resist in which a portion exposed by the exposure light is removed by the development. Also for a negative resist in which a portion that is not exposed by the exposed light is removed by the development, the exposing method according to the present invention is applied to cause the resist in the halftone resist portion to have a constant thickness and to carry out the patterning with high precision.

EMBODIMENT 1

Figure 5:
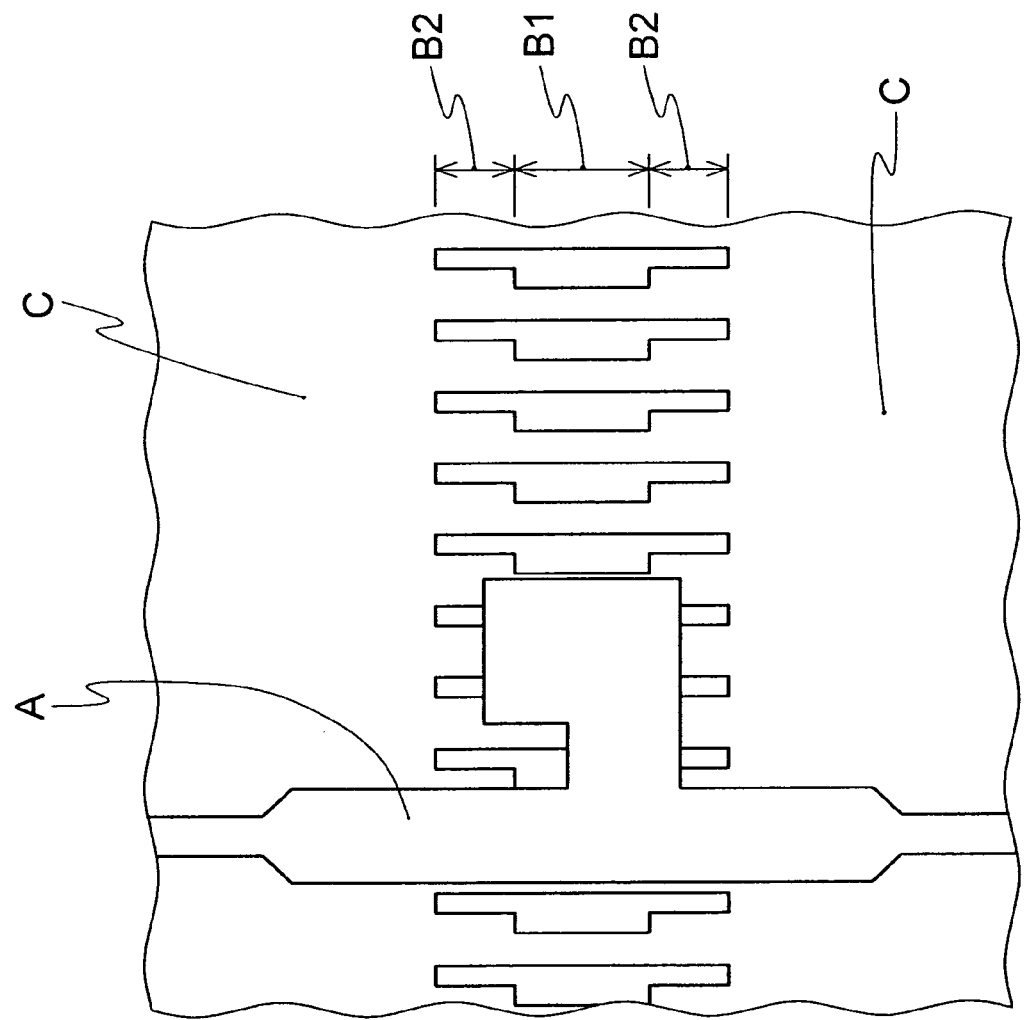
FIG. 5 is a view showing a pattern of a halftone mask to be used in a first Embodiment of the present invention.

FIG. 5 is an enlarged plan view showing the vicinity of a cross portion of a gate wiring and a source wiring in a photomask to be used in the present Embodiment. Partially transparent portions B1 and B2 of the photomask are provided by forming a striped shielding film such as Cr on a transparent substrate. The partially transparent portion B1 and the partially transparent portion B2 are set to be separate stripe patterns having different lines/spaces corresponding to the presence of the under-layer (which will be hereinafter referred to as a "gate electrode/wiring" because the gate electrode/wiring corresponds to the under layer in the present Embodiment).

As described above, an amount of transmission of the exposure light is reduced because the thickness of the resist is necessarily reduced in a portion having the gate electrode/wiring, and the amount of transmission of the exposure light is increased because the thickness of the resist is necessarily increased in a portion having no gate electrode/wiring. In the present Embodiment, the line/space of the stripe shape is set to 1.5 μm/1.5 μm is set such that a mask apertureratio (the rate of the area of a portion where a shielding film such as Cr is not provided and the exposure light can be transmitted) is 50% in the partially transparent portion B1 corresponding to the portion having the gate electrode/wiring, and the line/space of the stripe shape is set to 1.25 μm/1.5 μm is set such that the mask apertureratio is 55% in the partially transparent portion B2 corresponding to the portion having no gate electrode/wiring. Consequently, the amount of transmission of the exposure light is adjusted and the thickness of the residual film of the resist is made constant irrespective of the presence of the gate electrode/wiring.

Figure 6:
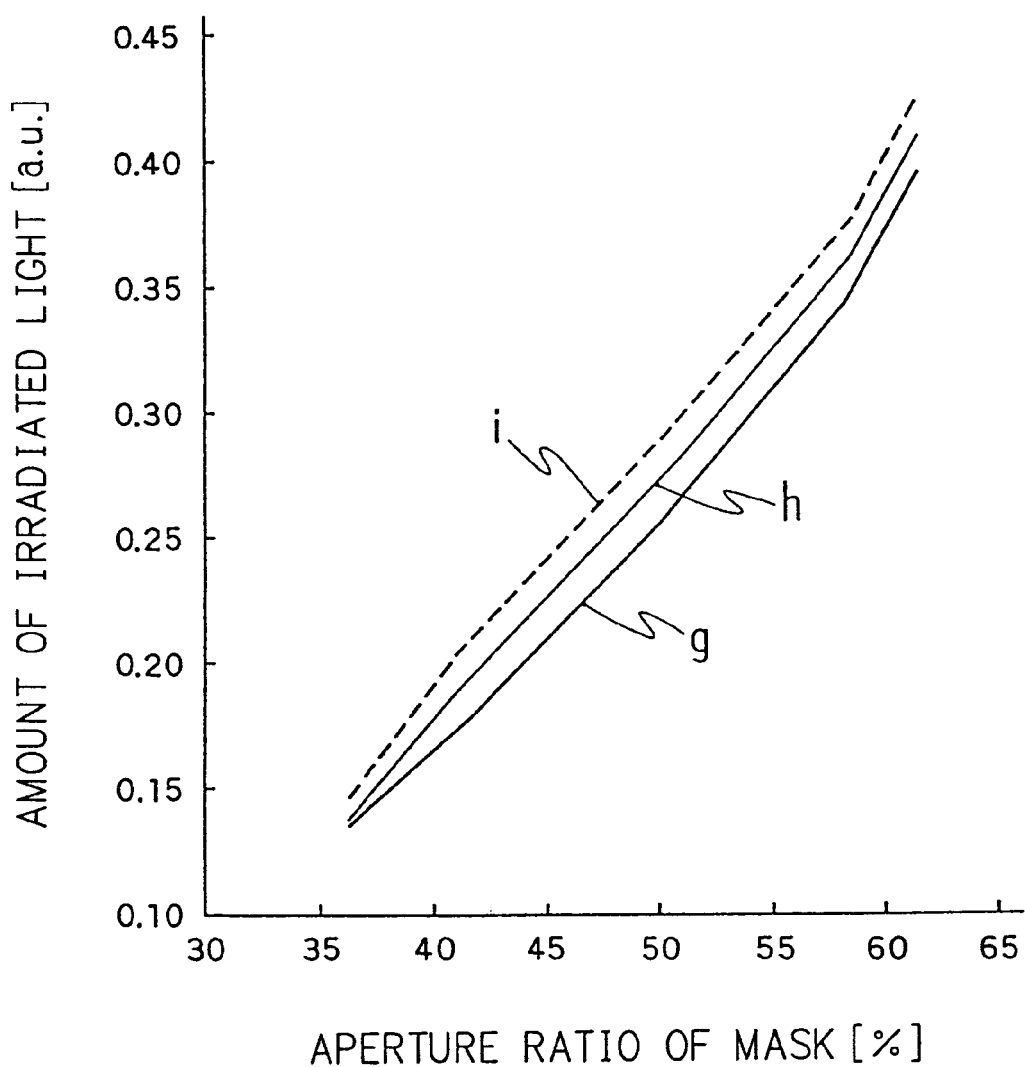
FIG. 6 is a graph showing the relationship between an apertureratio of a mask and an amount of light irradiation.

FIG. 6 is a graph in which an intensity of the light transmitted through the photomask is calculated for the cases in which g rays (wavelength: 436 nm), i rays (wavelength: 365 nm) and h rays (wavelength: 405 nm) are used as the light source of an exposing machine, respectively. In FIG. 6, a solid line g indicates the case in which the g rays are used as the light source, a broken line i indicates the case in which the i rays are used as the light source, and a thin line h indicates the case in which the h rays are used as the light source. It is apparent from FIG. 6 that an amount of exposure of the transmitted light (an amount of light irradiation) is 0.25 with a mask apertureratio of 50% (the case in which the light is completely transmitted is set to 1) and an amount of exposure of the transmitted light (an amount of light irradiation) is 0.30 with a mask apertureratio of 55% (the case in which the light is completely transmitted is set to 1) when the g rays are used as the light source of the exposing machine.

In the case in which the resist before exposure and development has a thickness of 1.50 μm in the portion having no substrate film, the resist is removed by 0.7 μm by the exposure and the development in the portion in which the amount of the transmitted light is 0.25 (the case in which the light is completely transmitted is set to 1), and the resist is removed by 1.1 μm in the portion in which the amount of the transmitted light is 0.30 (the case in which the light is completely transmitted is set to 1).

Accordingly, in the case in which a gate electrode/wiring having a thickness of 400 nm is present as the substrate film, the apertureratio of the partially transparent portion B1 in this portion is set to 55%, and the apertureratio of the partially transparent portion B2 in the portion in which the gate electrode/wiring is not present is set to 50%. Consequently, the thickness of the resist in the halftone portion after the exposure and the development can be uniformly set to approximately 0.40 μm irrespective of the presence of the gate electrode/wiring.

The apertureratios of the partially transparent portions B1 and B2, that is, the stripe patterns (line/space) are determined by factors including the thickness of the resist obtained immediately after the application of the resist (before the exposure and the development), the thickness of the gate electrode/wiring, a film to be first etched in the half tone portion and the like. Therefore, the stripe pattern (pattern/space) described in the present Embodiment is only illustrative and it is preferable that the stripe patterns (line/space) of the partially transparent portions B1 and B2 should be properly determined depending on each of the factors.

A process for manufacturing a TFT array substrate by a photolithographic step using the above-mentioned photomask will be explained.

Figure 7:
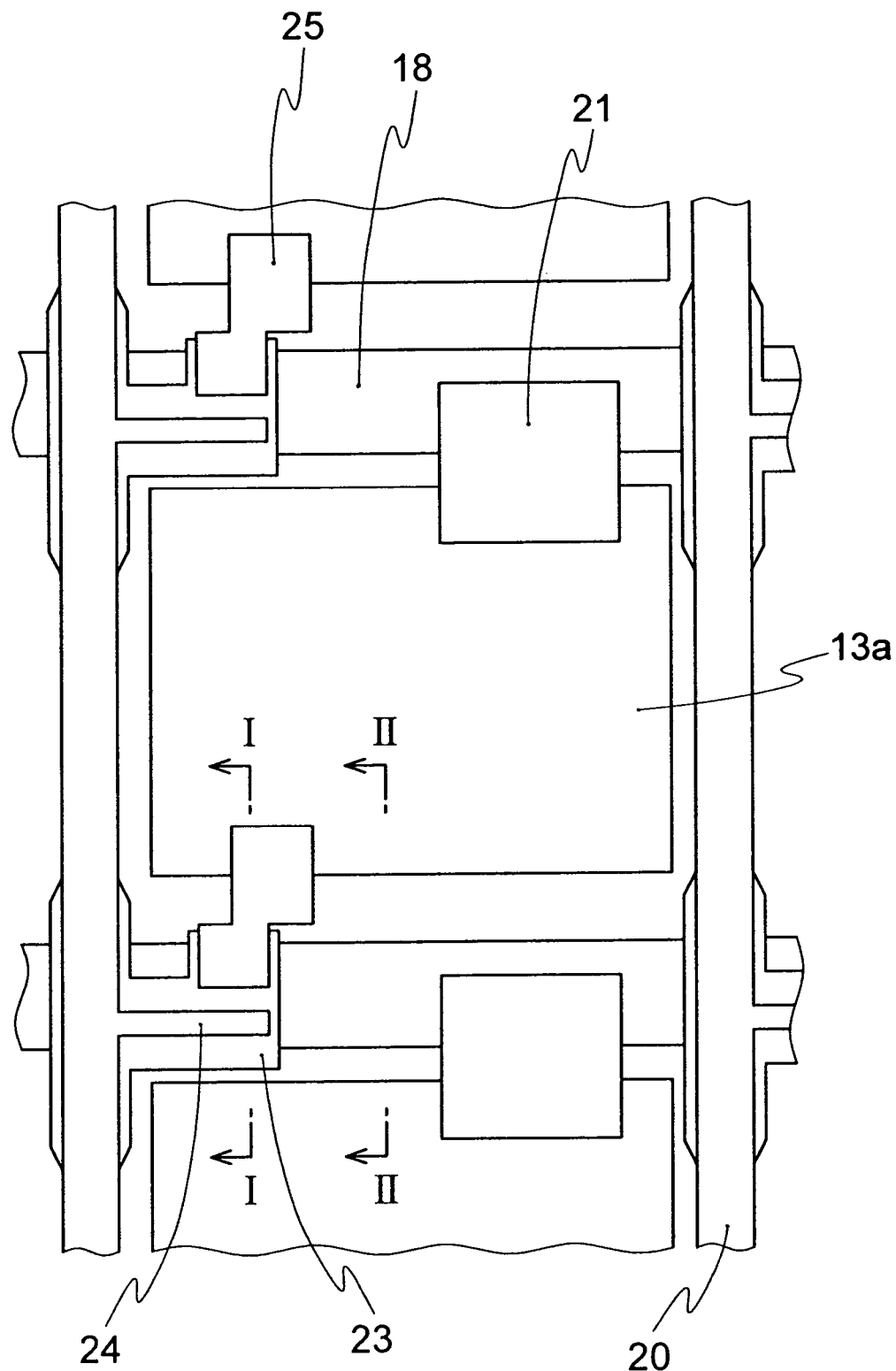
FIG. 7 is a plan view showing a TFT array substrate.

FIG. 7 is a plan view showing the structure of the TFT array substrate of an AMLCD, FIGS. 8 to 10 are sectional views taken along line I—I in FIG. 7 to show a manufacturing process, and FIGS. 11 and 12 are sectional views taken along line II—II in FIG. 7 to show a manufacturing process.

In FIGS. 7 to 12, the reference numeral 1 denotes an insulating substrate, the reference numeral 18 denotes a gate electrode/wiring comprising a transparent conductive layer 18a and a metal layer 18b, the reference numeral 13 denotes a pixel electrode comprising a transparent conductive layer 13a and a metal layer 13b, the reference numeral 15 denotes a gate insulating film, the reference numeral 16 denotes an intrinsic semiconductor layer, the reference numeral 17 denotes an impurity doped semiconductor layer containing an impurity such as P or B in a high concentration, the reference numeral 8 denotes a resist formed of a photosensitive organic resin or the like, the reference numeral 19 denotes a conductor layer to be a source electrode and a drain electrode, the reference numeral 20 denotes a source wiring, the reference numeral 21 denotes a storage capacitance electrode, the reference numeral 22 denotes a protective film such as $Si_3N_4$, and the reference numeral 23 denotes a semiconductor region in the plan view (FIG. 7). The reference numeral 24 denotes a source electrode and the reference numeral 25 denotes a drain electrode.

In FIG. 5 and FIGS. 7 to 12, the same components or components having the same functions have the same reference numerals.

First of all, a transparent conductive layer comprising a transparent conductive film such as ITO (Indium Tin Oxide), $SnO_2$ or InZnO, laminated layer thereof or mixed layer thereof is formed on the insulating substrate 1 by a method such as sputtering, evaporation, coating, CVD, a printing method or a sol-gel method. Subsequently, a substance comprising metal such as Cr, Al, Mo, W, Ti, Cu, Ag, Au or Ta, an alloy containing them as principal components or laminated layer thereof and having lower resistance than that of the transparent conductive layer is formed on the transparent conductive layer by a method such as sputtering, evaporation, CVD, a printing method or a sol-gel method. Consequently, it is possible to obtain a wiring structure in which at least one metal layer having low resistance is laminated on the transparent conductive layer.

Then, photolithography is carried out by using a resist or the like and the gate electrode/wiring 18 comprising the transparent conductive layer 18a and the metal layer 18b having low resistance is formed by an etching method or the like which is to be subsequently carried out. At the same time, the pixel electrode 13 having a layer structure formed by the transparent conductive layer 13a and the metal layer 13b having low resistance is also formed of the same material as that of the gate electrode/wiring 18 with the same structure (FIG. 8(a), FIG. 11(a)).

The transparent conductive layer such as ITO is usually polycrystal. In this case, a substance containing, for example, ferric chloride or hydrochloric acid and nitric acid as principal components is used as an etchant for etching the ITO at time of formation of the gate electrode/wiring or the like. However, if the ITO is formed in amorphous state and the metal layer is formed on the ITO at a temperature at which the ITO is crystallized or less, the ITO is maintained in an amorphous state and can be etched with comparatively weak acid such as oxalic acid, for example. Thus, in the case in which Al or the like is used for the metal layer, the metal such as Al is less etched when the ITO is etched. Accordingly, it is desirable that the ITO is maintained in the amorphous state before at least the metal layer is completely etched and that the metal layer such as Al should be formed at a lower temperature than approximately 160° C. at which the ITO is crystallized. Moreover, the ITO may be etched by using a gas such as HCl, HBr or HI in order to decrease a damage over the metal layer.

Subsequently, by various CVD methods such as plasma CVD, sputtering method, evaporation methods, coating methods or the like, the gate insulating film 15 with a thickness of approximately 400 nm is formed by $Si_3N_4$, $SiO_xN_y$, $SiO_2$, $Ta_2O_5$, $Al_2O_5$ or the like, or these substances with the composition deviated slightly from the stoichiometry or lamination thereof.

Furthermore, by a plasma CVD method or a spattering method, the intrinsic semiconductor layer 16 is formed in a thickness of approximately 150 nm by a-Si:H (hydrogenated amorphous silicon) which is not intentionally doped with an impurity to be a dopant, or which is intentionally doped and the concentration of the impurity is approximately 50 ppm or less, or has a concentration of the dopant set such that a leak current in dark state does not exceed 50 pA under the actual use voltage conditions of a TFT, and is to be used as a semiconductor layer for a channel.

Figure 8A:
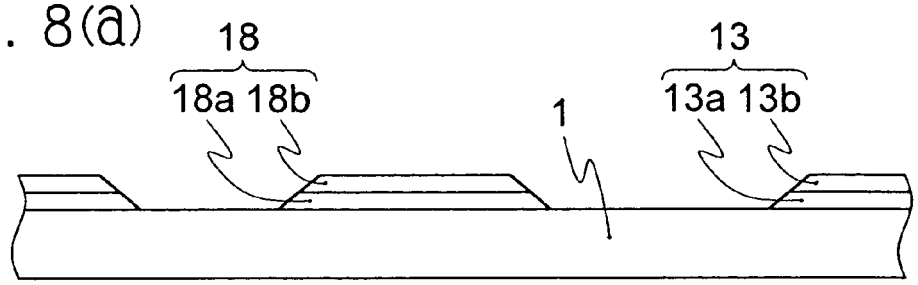
FIG. 8 is a sectional view showing a process for manufacturing a TFT array substrate according to the first Embodiment of the present invention.
Figure 8B:
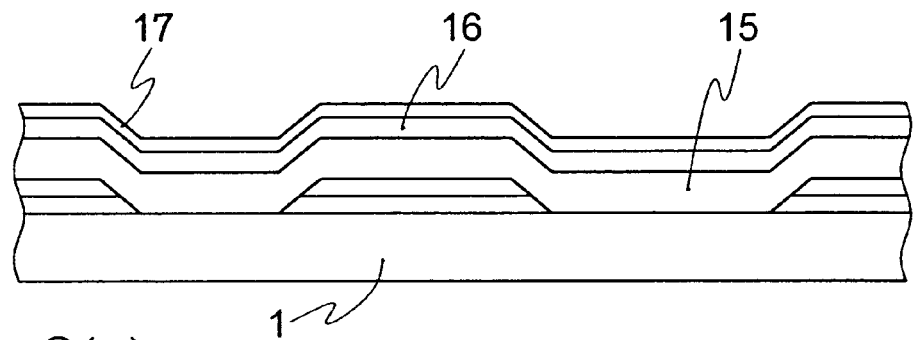
Figure 11A:
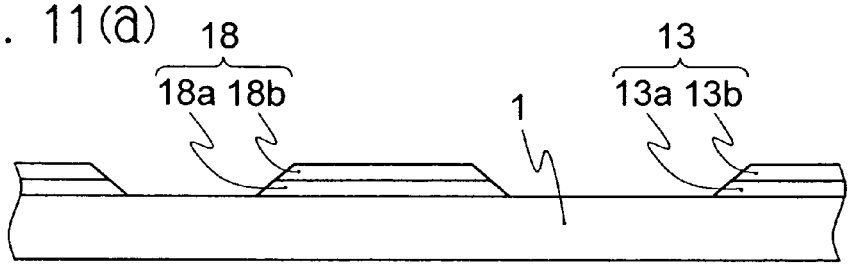
FIG. 11 is a sectional view showing the process for manufacturing a TFT array substrate according to the first Embodiment of the present invention.
Figure 11B:
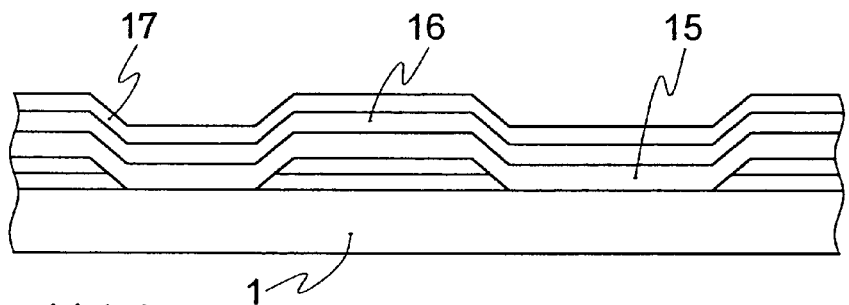

In order to take a contact with the conductive layer 19 (the source electrode 24, the drain electrode 25), moreover, an doped semiconductor layer 17 such as an $n^+$a-Si:H film or a $n^+$Si microcrystal layer which is doped with an impurity in a high concentration in which an impurity such as phosphorus, antimony or boron is present in a film at an atomic ratio of 0.05% or more, for example, is formed in a thickness of approximately 30 nm by the plasma CVD method or the sputtering method (FIG. 8(b), FIG. 11(b)).

Subsequently, the whole surface is first coated with a resist. Then, a photomask is used to carry out exposure, and furthermore, development to form a resist 8 (FIG. 8(c), FIG. 11(c)).

Figure 8C:
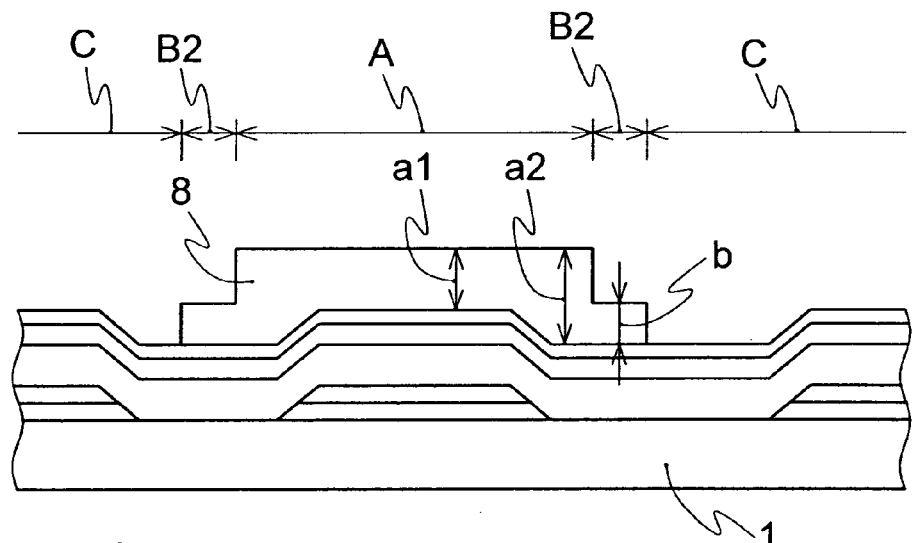
Figure 11C:
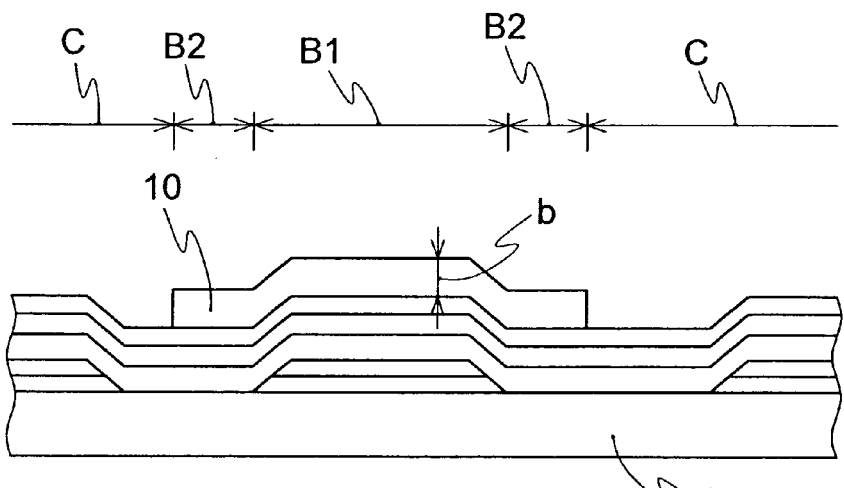

At this time, the structure of the photomask and the shape of the resist 8 obtained after the development are set as follows. First of all, as shown in FIG. 5, FIG. 8(c) and FIG. 11(c), the resist is not formed (is removed) in at least a part of a portion to be the pixel electrode 13 by using a transparent portion C of the photomask. In a portion in which the intrinsic semiconductor layer 16 is to remain, the resist is exactly left in thicknesses of a1 and a2 by using a shielding portion A of the photomask.

For example, in a region in which only the intrinsic semiconductor layer 16 and the doped semiconductor layer 17 are to be etched and the gate insulating film 15 is to remain, the resist having a thickness of b is left by using partially transparent portions B1 and B2 of the photomask. At this time, a portion in which the gate wiring 18 is present as an under layer is set to be the partially transparent portion B1 having a small amount of light transmission and a portion in which the gate wiring 18 is not present is set to be the partially transparent portion B2 having a large amount of light transmission. Consequently, it is possible to obtain a resist having an equal thickness of b irrespective of the presence of the gate wiring 18.

Accordingly, the dimensions of line/space of the stripe pattern shapes of the partially transparent portions B1 and B2 are set such that an amount of exposure (an amount of light irradiation) in the partially transparent portion B2 is larger than an amount of exposure (an amount of light irradiation) in the partially transparent portion B1 by the amount of exposure corresponding to the thickness of the gate electrode/wiring 18. As a result, the thickness of the resist 8 can be set to as follows. Tickness in shielding portion A>partially transparent portion B1= partially transparent portion B2>transparent portion C (a film thickness of substantially 0 (zero)) as shown in FIG. 8(c) and FIG. 11(c).

It is desirable that a portion on the gate wiring between adjacent source wirings comprises a halftone resist having a thickness of b by the partially transparent portions B1 and B2, the intrinsic semiconductor layer 16 and the doped semiconductor layer 17 in this portion should be removed and a portion between the adjacent source wirings should be brought into an electrical insulation state.

Figure 8D:
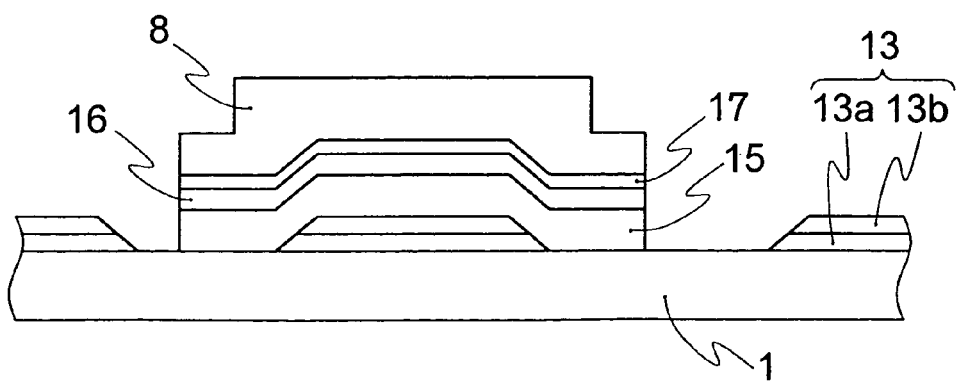
Figure 11D:
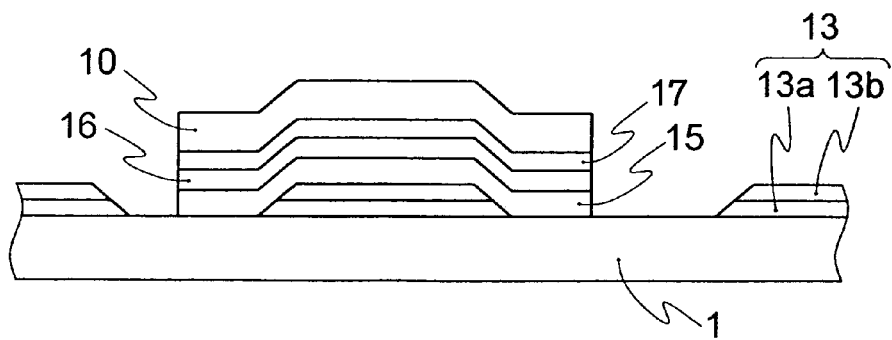

Subsequently, the semiconductor films, for example, the doped semiconductor layer 17 and the intrinsic semiconductor layer 16, and the gate insulating film 15 such as $Si_3N_4$ are etched (FIG. 8(d), FIG. 11(d)). The etching is carried out with gas containing HCl as a principal component, gas containing $CF_4$ as principal component, mixed gas of $CF_4$ and $O_2$ gas containing $SF_6$ as a principal component or the like, for example. As a result, the doped semiconductor layer 17, the intrinsic semiconductor layer 16 and the gate insulating film 15 in at least a portion which is provided on the pixel electrode 13 and serves to transmit light are removed. While the doped semiconductor layer 17, the intrinsic semiconductor layer 16 and the gate insulating film 15 may be simultaneously etched by using a single kind of gas such as $CF_4$ or $CH_4+O_2$, for example, at least the intrinsic semiconductor layer 16 and the gate insulating film 15 may be subjected to dry etching with different kind of etching gas so as to suppress the etching of the gate insulating film 15 when the intrinsic semiconductor layer 16 is to be etched. In this case, $SF_6$, HCl, $F_{123}$ or a mixed gas thereof, or a mixed gas of them and an inactive gas or $O_2$ may be used for etching the intrinsic semiconductor layer 16, and $CF_4$, $SF_6$ or mixed gas thereof or a mixed gas of them and $O_2$ or an inactive gas may be used for etching the gate insulating film 15.

Figure 9A:
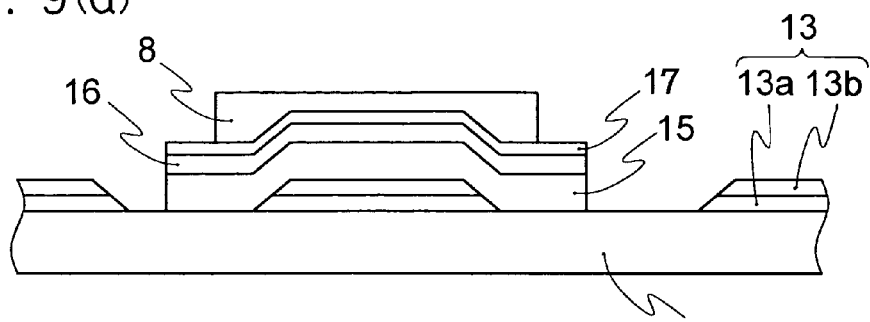
FIG. 9 is a sectional view showing the process for manufacturing a TFT array substrate according to the first Embodiment of the present invention.
Figure 12A:
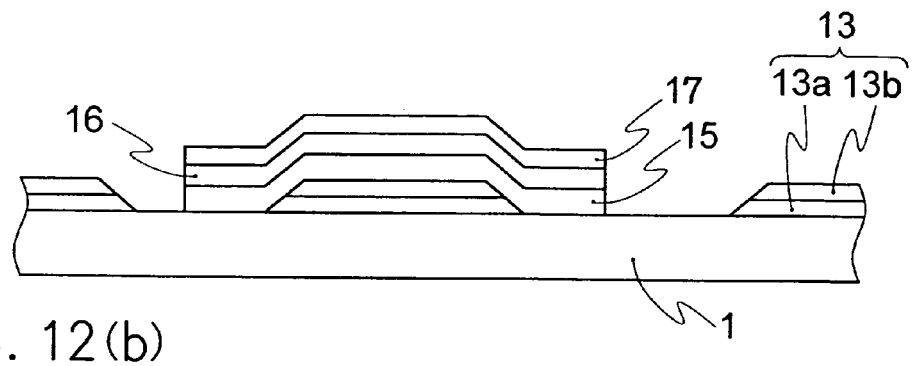
FIG. 12 is a sectional view showing the process for manufacturing a TFT array substrate according to the first Embodiment of the present invention.

Subsequently, ashing is carried out by using a plasma such as an oxygen plasma to reduce the resist, thereby removing the resist in the partially transparent portions B1 and B2 (FIG. 9(a), FIG. 12(a)). At this time, the resist in the shielding portion A is simultaneously subjected to the ashing so that the thickness becomes smaller than the initial thickness. Accordingly, it is necessary to control the initial thickness and shape of the resist, ashing conditions and the like so as to maintain such a thickness that the resist in the shielding portion A after the ashing can sufficiently protect a portion which is not etched during subsequent etching.

The step of removing the resist in the partially transparent portions B1 and B2 is not carried out separately but the resist in the semi-transmitting portions B1 and B2 may be removed at the same time that the doped semiconductor layer 17, the intrinsic semiconductor layer 16 and the gate insulating film 15 are etched by utilizing an effect in which the resist is also reduced somewhat when the doped semiconductor layer 17, the intrinsic semiconductor layer 16 and the gate insulating film 15 are etched.

Figure 12B:
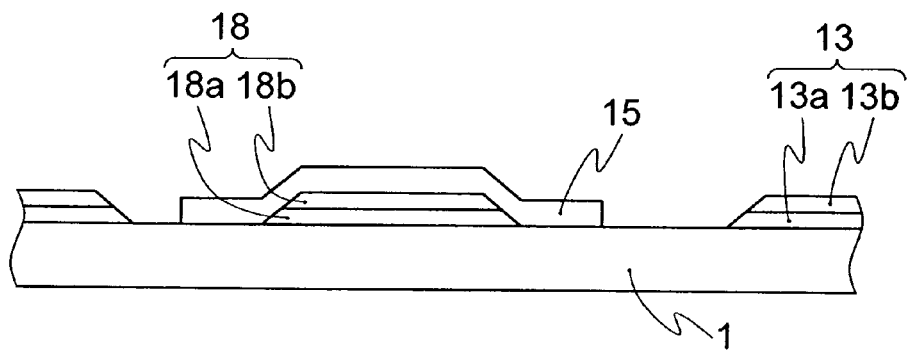

Subsequently, at least the doped semiconductor layer 17 and the intrinsic semiconductor layer 16 are etched by a dry etching method and are thus removed from the semi-transmitting portions B1 and B2 (FIG. 9(b), FIG. 12(b)).

Figure 9B:
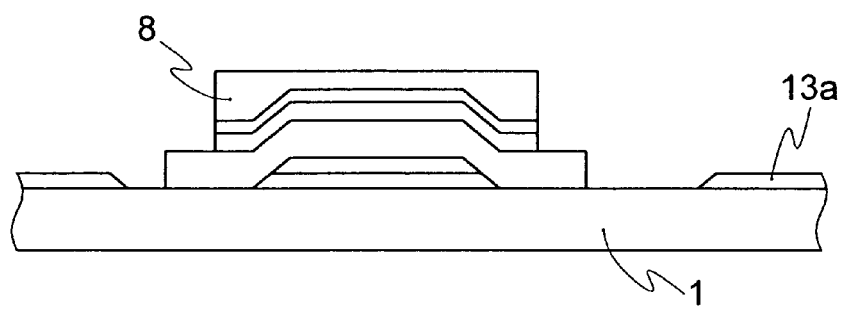
Figure 12C:
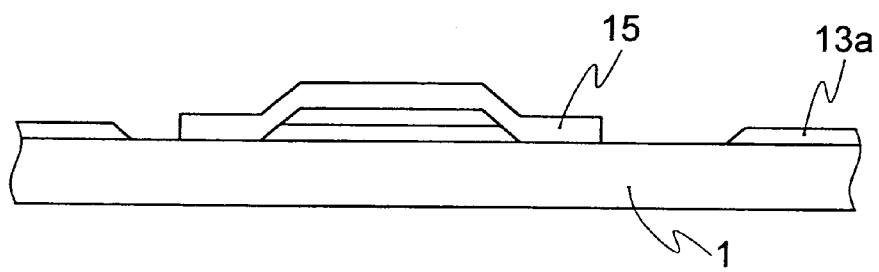

Then, the metal layer 13b is removed by wet etching or dry etching in the portion in which the doped semiconductor layer 17, the intrinsic semiconductor layer 16 and the gate insulating film 15 provided on the pixel electrode 13 are removed by etching (FIG. 9(b), FIG. 12(c)).

Figure 9C:
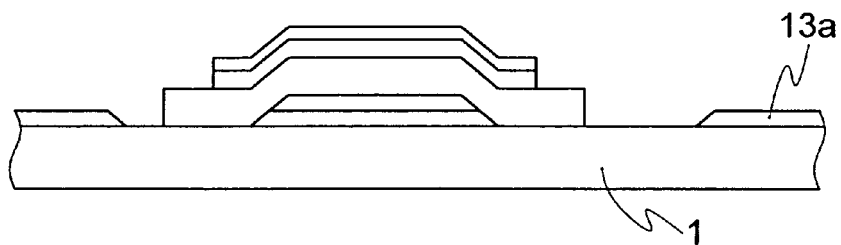

Thereafter, the resist 8 remaining in the shielding portion A is removed (FIG. 9(c)).

Figure 9D:
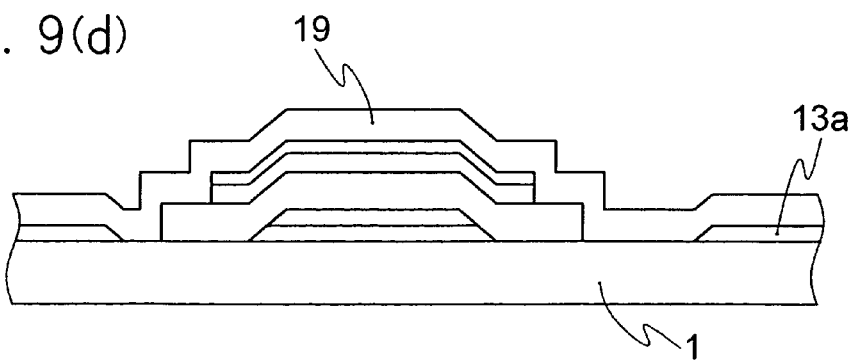

For example, subsequently, a conductor layer 19 comprising Cr, Al, Ti, Ta, Au, Ag, W, Mo, Mo—W, Cu, an alloy containing them as principal components, or multilayered substance thereof is formed (FIG. 9(d)).

Figure 10A:
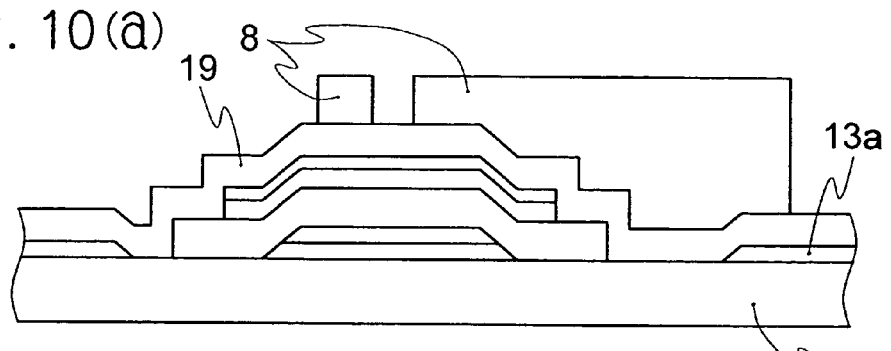
FIG. 10 is a sectional view showing the process for manufacturing a TFT array substrate according to the first Embodiment of the present invention.
Figure 10B:
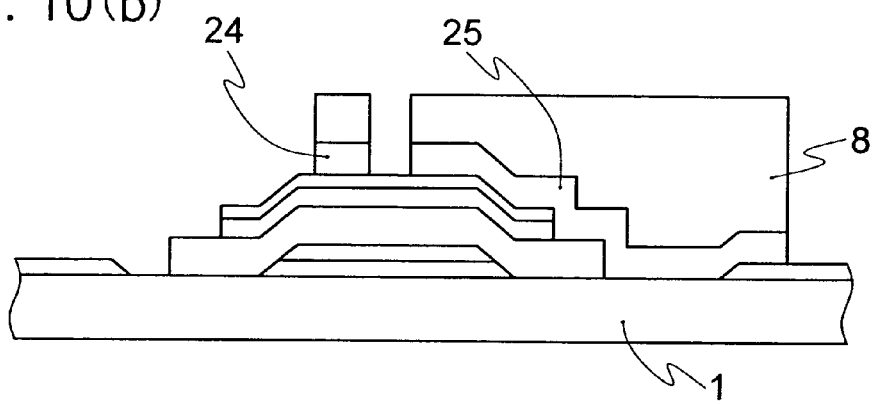

Then, the resist 8 is applied to carry out photolithography (FIG. 10(a)) and the conductor layer 19 is etched by wet or dry etching or the like, thereby forming a drain electrode 25, s source electrode 24 and a source wiring 20 (FIG. 10(b)).

At this time, a storage capacitance electrode 21 for forming a storage capacitance Cs is simultaneously formed from the conductor layer 19. The storage capacitance electrode 21 is opposed to the gate wiring 18 in a next or former stage to interpose at least the gate insulating film 15, for example. Moreover, in addition to the gate insulating layer 15, the doped semiconductor layer 17 and the intrinsic semiconductor layer 16 may be left between the storage capacitance electrode 21 and the gate wiring 18.

Figure 10C:
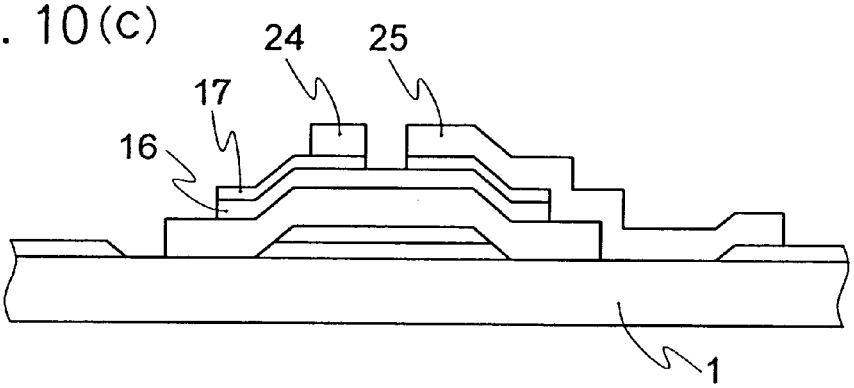

Subsequently, the doped semiconductor layer 17 provided between the source electrode 24 and the drain electrode 25 is removed by the dry etching or the like, thereby finally peeling the resist 8 (FIG. 10(c)).

Figure 10D:
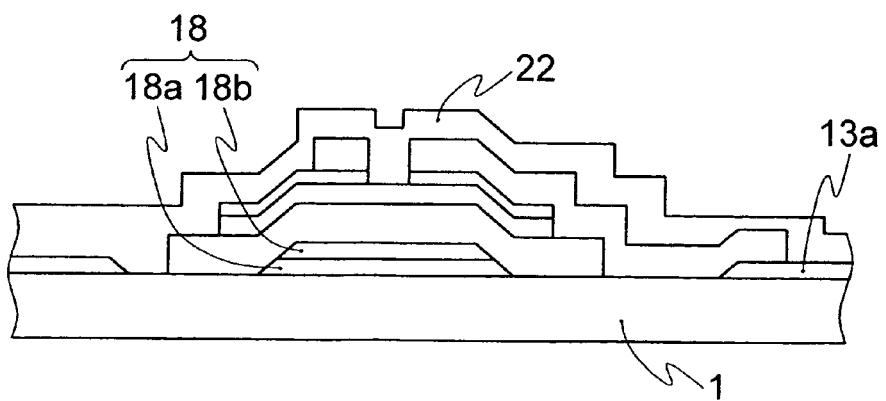
Figure 12D:
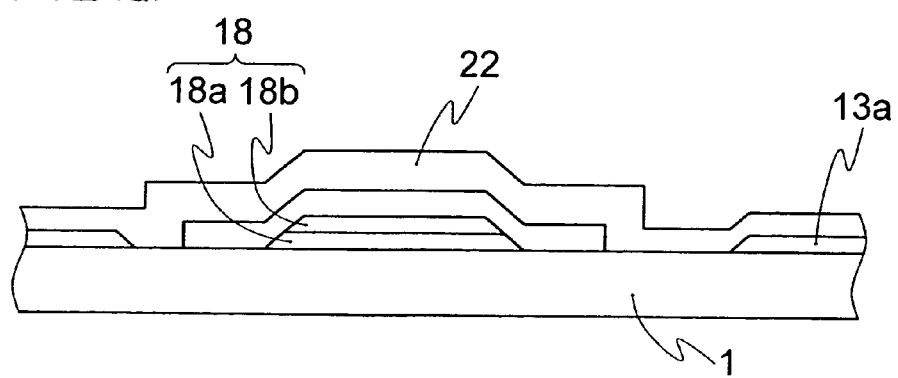

Then, an insulating protective film 22 is formed of $Si_3N_4$, $SiO_2$, or mixture and lamination thereof (FIG. 10(d), FIG. 12(d)).

In order to form a contact hole in a gate terminal portion and a source terminal portion which are connected to an external TCP or the like to input and output signals, thereafter, a resist is applied to carry out photolithography and to form a resist pattern and a contact hole is opened on the protective film 22 by a dry etching or wet etching method using a $CF_4$ based gas or the like. After the etching is completed, the resist is removed.

By the process described above, a TFT array substrate is manufactured by carrying out the photolithography four times.

The protective film 22 does not need to be formed.

Subsequently, an orientation film is formed on the TFT array substrate and is opposed to a counter substrate provided with at least an orientation film and a common electrode on the surface, and furthermore, liquid crystal is injected between both substrates, thereby forming an active matrix type liquid crystal display.

The TFT array substrate having the structure shown in FIGS. 7 to 12 and the liquid crystal display using the same are formed by the process described above.

EMBODIMENT 2

Figure 13:
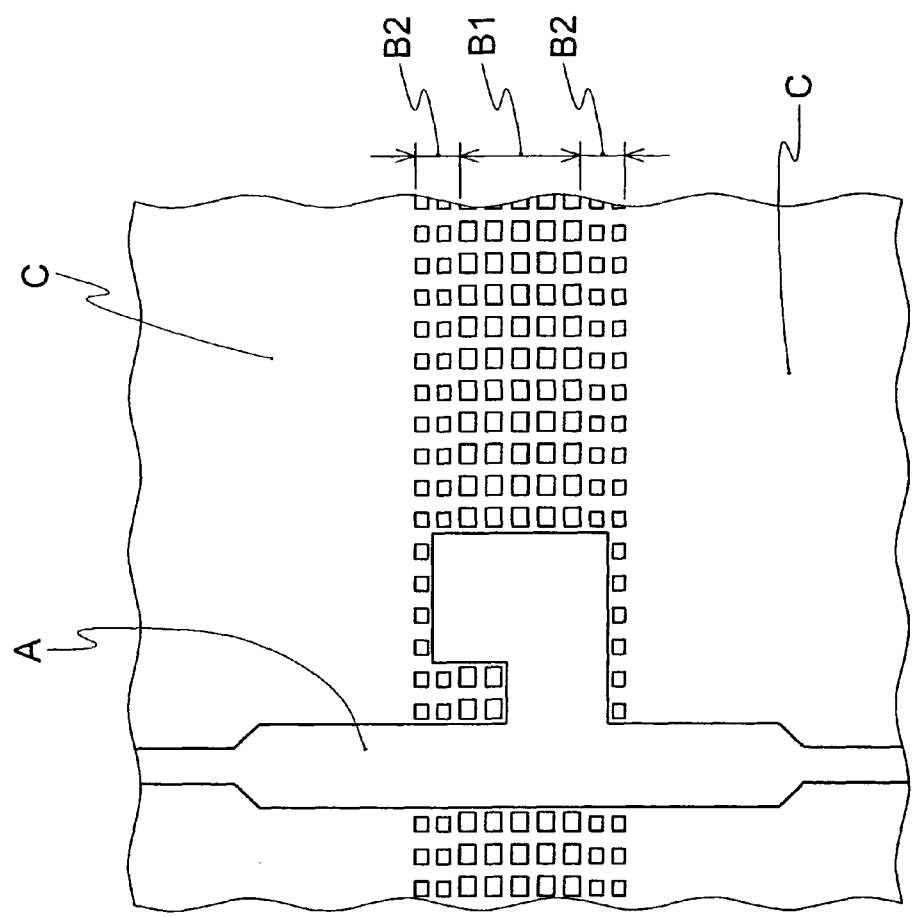
FIG. 13 is a view showing a pattern of a halftone mask to be used in a second Embodiment of the present invention.

It is also possible to use a photomask having a dot-shaped partially transparent portion shown in FIG. 13 in place of the photomask having the stripe-shaped partially transparent portion shown in FIG. 5 according to the first Embodiment, and the thickness of a halftone resist can be made constant irrespective of the presence of a gate electrode/wiring in the same manner as in the first Embodiment.

FIG. 13 is an enlarged plan view of the photomask to be used in the present Embodiment, showing the vicinity of a cross portion of the gate wiring and the source wiring. Partially transparent portions B1 and B2 of the photomask have a shielding film such as Cr arranged like a rectangular dot shape on a transparent substrate, and the length of a side of each dot (hereinafter referred to as a "pattern side") and a space between dots (hereinafter referred to as a "space") are different between the semi-transmitting portion B1 and the semi-transmitting portion B2.

As described above, the amount of light transmission of exposed light is reduced in a portion in which the gate electrode/wiring is present and the amount of light transmission of the exposed light is increased in a portion in which the gate electrode/wiring is not present. In the present Embodiment, the pattern side/space is set to 1.50 µm/1.50 µm such that the amount of the exposure light transmitted through the photomask (the amount of light irradiation) is 0.25 (the case in which the light is completely transmitted is set to 1) in the partially transparent portion B1 corresponding to the portion in which the gate electrode/wiring is present, and the pattern side/space is set to 2.0 µm/1.0 µm such that the amount of the exposure light transmitted through the photomask (the amount of light irradiation) is 0.30 (the case in which the light is completely transmitted is set to 1) in the partially transparent portion B2 corresponding to the portion in which the gate electrode/wiring is not present. Consequently, the amount of transmission of the exposure light is adjusted to cause the residual film of the resist to have a constant thickness irrespective of the presence of the gate electrode/wiring.

The photolithographic step is carried out by using the photomask shown in FIG. 13, thereby forming the TFT array substrate in the same process as in the first Embodiment.

A dot pattern (pattern side/space) in the partially transparent portions B1 and B2 is determined by factors including the thickness of the resist obtained immediately after the application of the resist (before exposure and development), the thickness of the gate electrode/wiring, an etched film to be first etched in the halftone portion and the like. Accordingly, the dot pattern (pattern side/space) described in the present Embodiment is only illustrative and it is preferable that the dot pattern (pattern side/space) in the semi-transmitting portions B 1 and B2 should be properly determined depending on each of the factors.

EMBODIMENT 3

Another Embodiment of the present invention will be described with reference to FIGS. 14, 15 and 16.

In the first and second Embodiments described above, the halftone mask is provided with two kinds of partially transparent portions having different amounts of exposure light transmitted therethrough. In the present Embodiment, a halftone mask to be used for carrying out patterning over a first etched film 6 and a second etched film 7 has one kind of pattern in a partially transparent portion. In other words, there is one kind of amount of exposure light transmitted through the partially transparent portion.

Figure 14A:
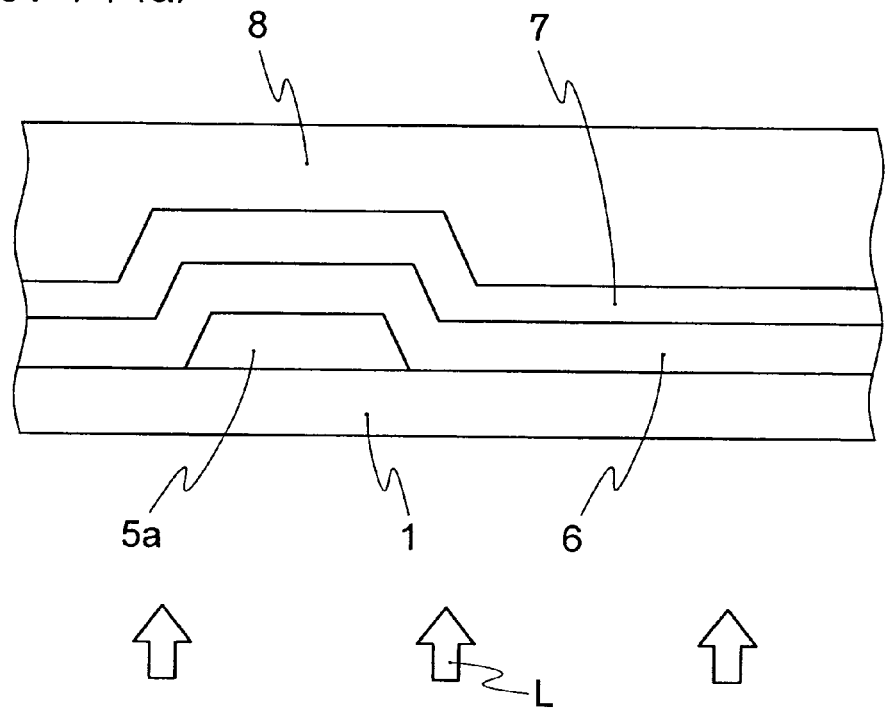
FIG. 14 is a sectional view showing a process for manufacturing a TFT array substrate according to a third Embodiment of the present invention.

As shown in FIG. 14(a), a substrate film 5a is formed on a transparent substrate 1, and furthermore, the first film to be etched 6 and the second film to be etched 7 are formed. The substrate film 5a has a shielding property.

In order to carry out the patterning over the first film to be etched 6 and the second film to be etched 7, first of all, the whole surface is coated with a resist 8.

Then, exposure is carried out by light L from below the transparent substrate 1 (the side on which the substrate film 5a, the first etched film 6, the second etched film 7, the resist film 8 and the like are not formed). The resist 8 in the portion in which the substrate film 5a is not present is exposed by using the shielding substrate film 5a as a mask.

At this time, the amount of exposure (the amount of light irradiation) is adjusted such that the portion in which the under layer is not present is exposed by only the amount of exposure corresponding to the thickness of the under layer.

Figure 14B:
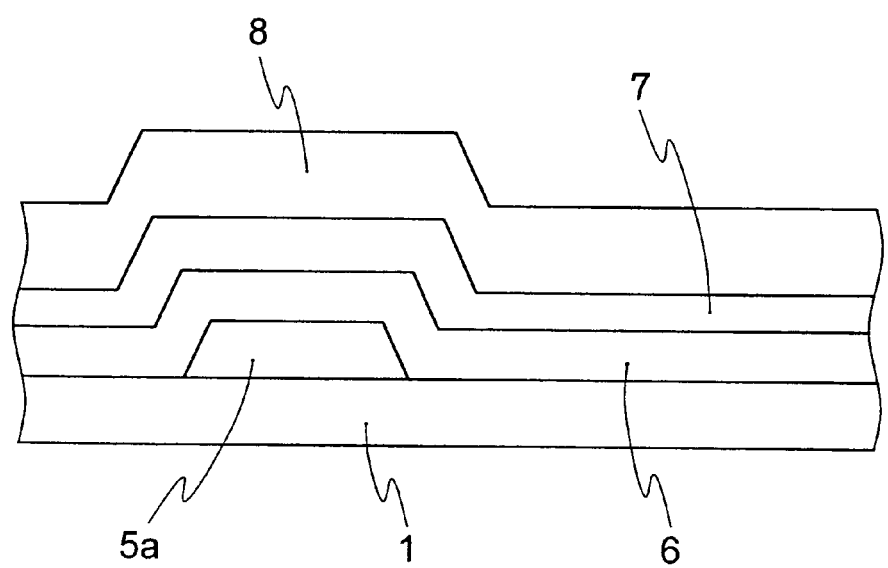

When the development is carried out, the resist 8 having a uniform thickness can be obtained over the whole surface irrespective of the presence of the substrate film 5a (FIG. 14(b)).

Then, when the halftone exposure and the development are carried out by using a photomask 14b having a shielding portion A, a partially transparent portion B and a transparent portion C, it is possible to obtain a halftone resist having a constant thickness of b irrespective of the presence of the substrate film 5a (FIG. 15(a)).

According to the present Embodiment, the thickness of the resist can be made constant irrespective of the presence of the substrate film 5a. Therefore, the resist 8 obtained after the exposure and the development comprises a pattern having three kinds of thicknesses of a portion having a thickness of a corresponding to the shielding portion A of the photomask, a portion having a thickness of b corresponding to the partially transparent portion B of the photomask, and a portion having a thickness of 0 (zero) corresponding to the transparent portion C of the photomask.

By using the resist 8, the first film to be etched 6 and the second film to be etched 7 in the transparent portion C in which the resist 8 is not formed are etched (FIG. 15(b)).

Figure 16A:
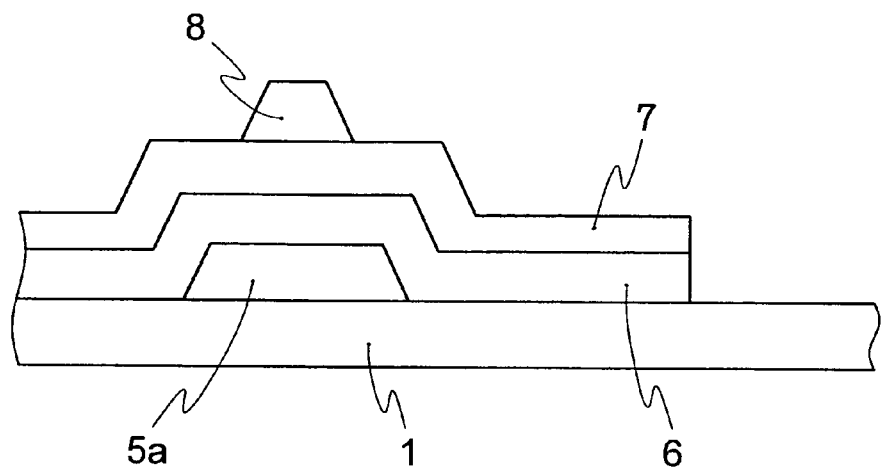
FIG. 16 is a sectional view showing the process for manufacturing a TFT array substrate according to the third Embodiment of the present invention.
Figure 16B:
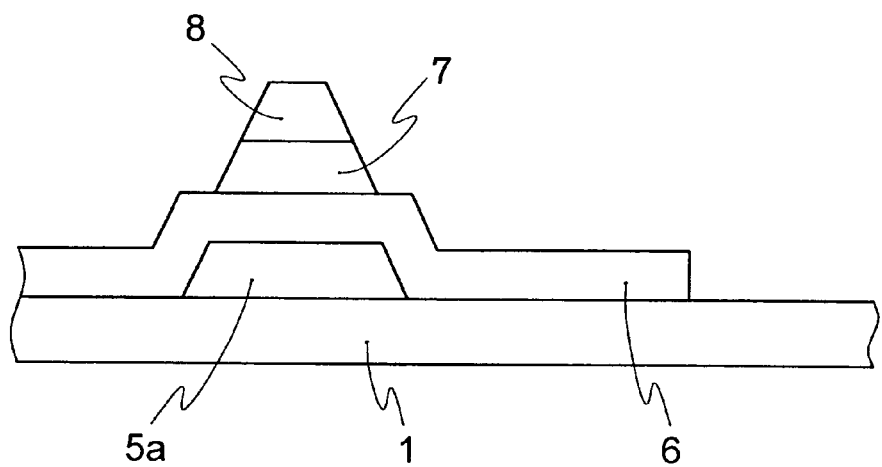
Figure 16C:
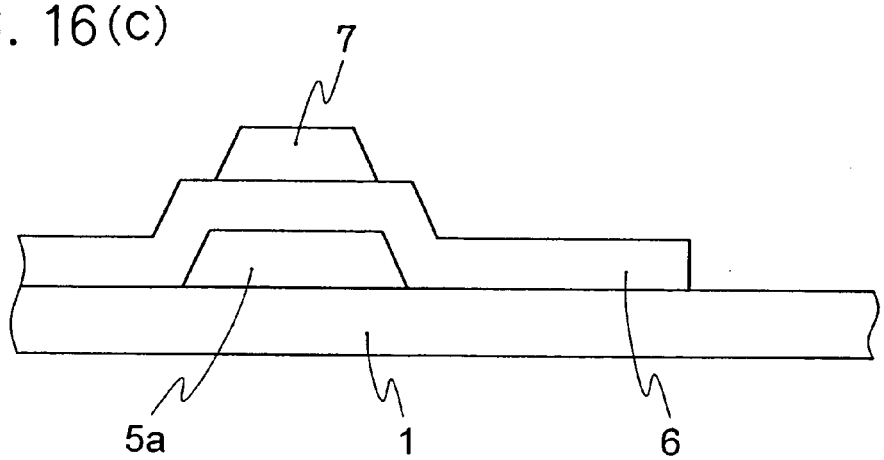

Then, the halftone resist 10 is removed by ashing (FIG. 16(a)), the second film to be etched 7 is etched using the residual thick resist 8 (FIG. 16(b)), and the resist 8 is finally removed (FIG. 16(c)). At a one-time photolithographic step, two layers of the first film to be etched 6 and the second film to be etched 7 can be patterned to have different patterns, respectively.

While the resist is exposed from below the substrate and is developed and the exposure and the development are then carried out by using the photomask in the above description, the resist is not developed after the exposure from below the substrate but the development may be collectively carried out after the exposure by using the photomask.

As described above, according to the present Embodiment, even if the halftone resist portion of the photomask has one kind of pattern, the halftone resist can have a constant thickness irrespective of the presence of the substrate film and the patterning can be carried out with high precision by performing back exposure before the halftone exposure is executed.

EMBODIMENT 4

A further Embodiment of the present invention will be described with reference to FIGS. 17, 18 and 19.

In the same manner as in the third Embodiment, also in the present Embodiment, a halftone mask to be used for patterning a first film to be etched 6 and a second film to be etched 7 has one kind of pattern in a partially transparent portion. In other words, there is one kind of amount of exposed light transmitted through the partially transparent portion.

Figure 17A:
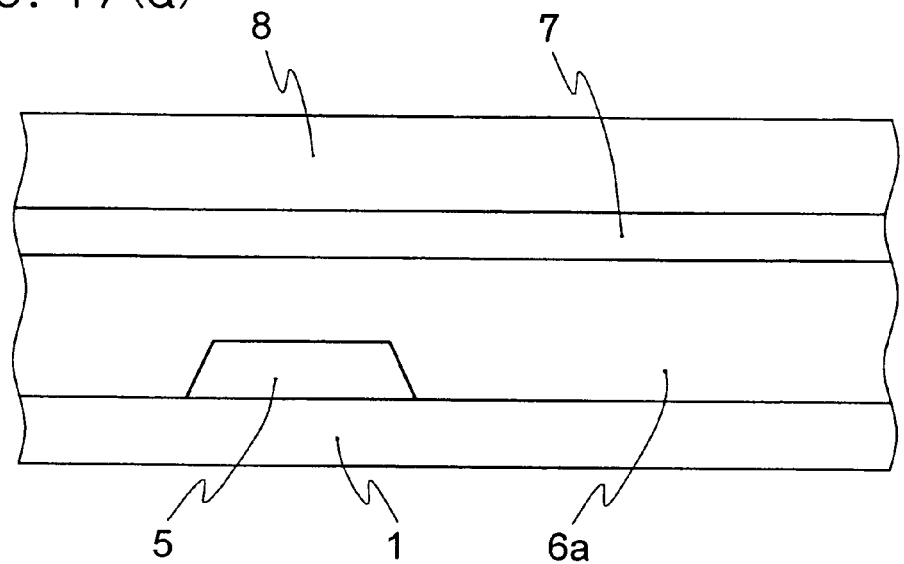
FIG. 17 is a sectional view showing a process for manufacturing a TFT array substrate according to a fourth Embodiment of the present invention.
Figure 17B:
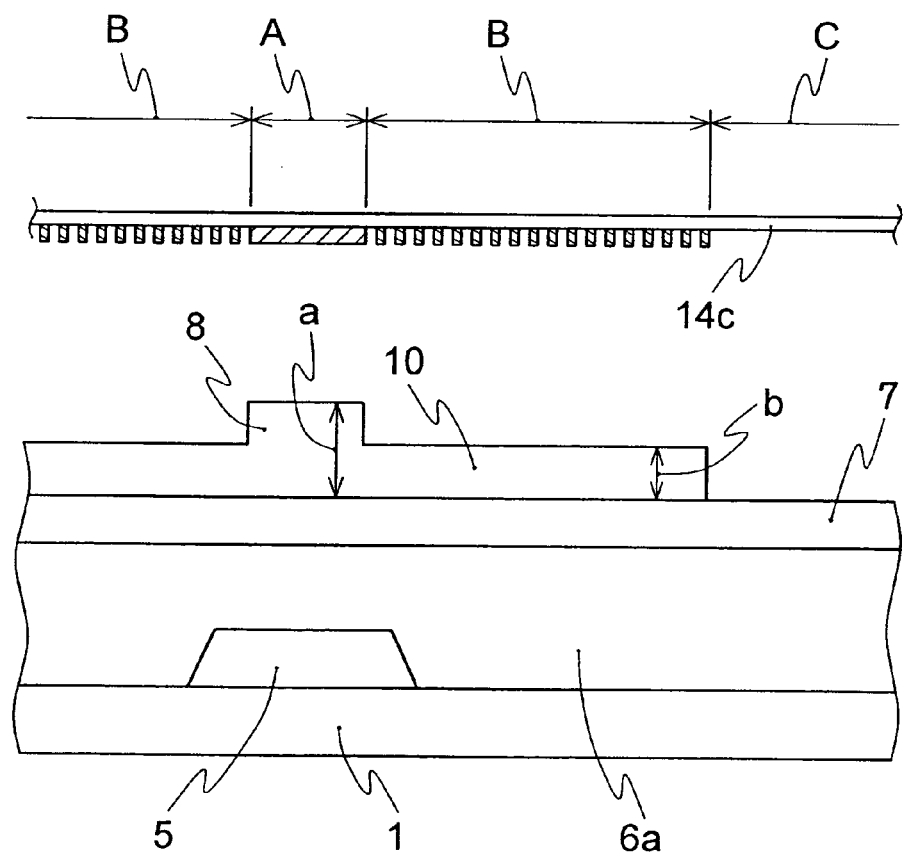

As shown in FIG. 17(a), a substrate film 5 is formed on a substrate 1, and furthermore, a first film to be etched 6a and the second film to be etched 7 are formed. Concavo-convex portions formed by the presence of the substrate film 5 are flattened by the first film to be etched 6a and the top surface of the first film to be etched 6a is flat. Accordingly, the second film to be etched 7 and the resist 8 applied onto the second film to be etched 7 have almost uniform thicknesses over a whole region.

As one method for implementing such flattening, for example, an organic resin film having a thickness of 3 μm is used as the first film to be etched 6a. The organic resin film may be photosensitive or non-photosensitive.

By using the first film to be etched 6a to be a flattened film, the thickness of the resist 8 obtained immediately after the application (before exposure and development) is made constant. Consequently, the resist in the halftone portion obtained after the halftone exposure and development by using a photomask 14c can have a constant thickness of b irrespective of the presence of the substrate film 5 (FIG. 17(b)).

While the flattened film has a thickness of 3 μm as an example in the present Embodiment, it is preferable that the thickness of the flattened film should be properly determined in consideration of the thickness of the substrate film, the material of the flattened film and the like.

According to the present Embodiment, the thickness of the resist can be made constant irrespective of the presence of the substrate film 5a. Therefore, the resist 8 obtained after the exposure and development comprises a pattern having three kinds of thicknesses of a portion having a thickness of a corresponding to a shielding portion A of the photomask, a portion having a thickness of b corresponding to a partially transparent portion B of the photomask, and a portion having a thickness of 0 (zero) corresponding to a transparent portion C of the photomask.

Figure 18A:
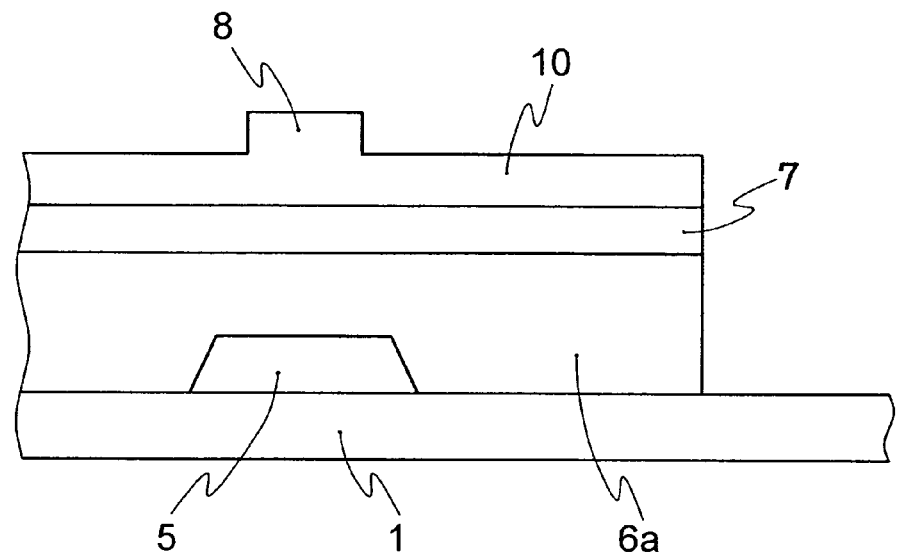
FIG. 18 is a sectional view showing the process for manufacturing a TFT array substrate according to the fourth Embodiment of the present invention.

By using the resist 8, the first film to be etched 6a and the second film to be etched 7 in the transparent portion C in which the resist 8 is not formed are etched (FIG. 18(a)).

Figure 18B:
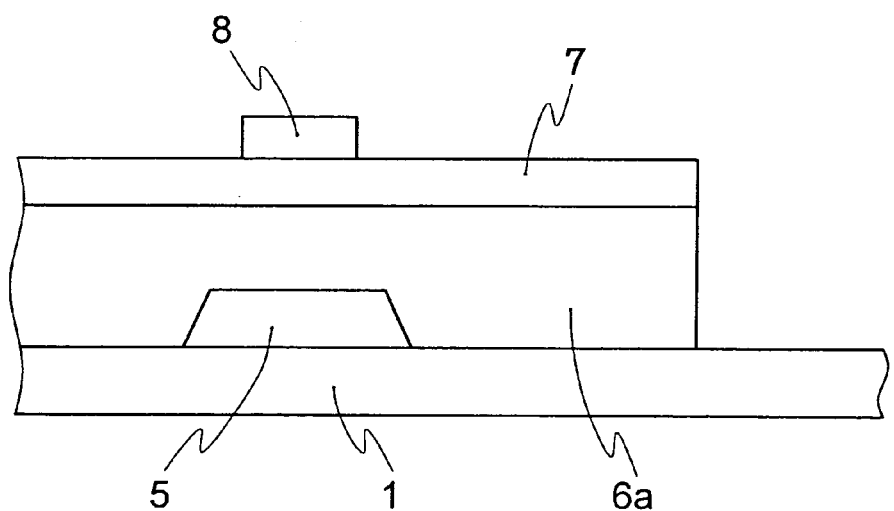
Figure 19A:
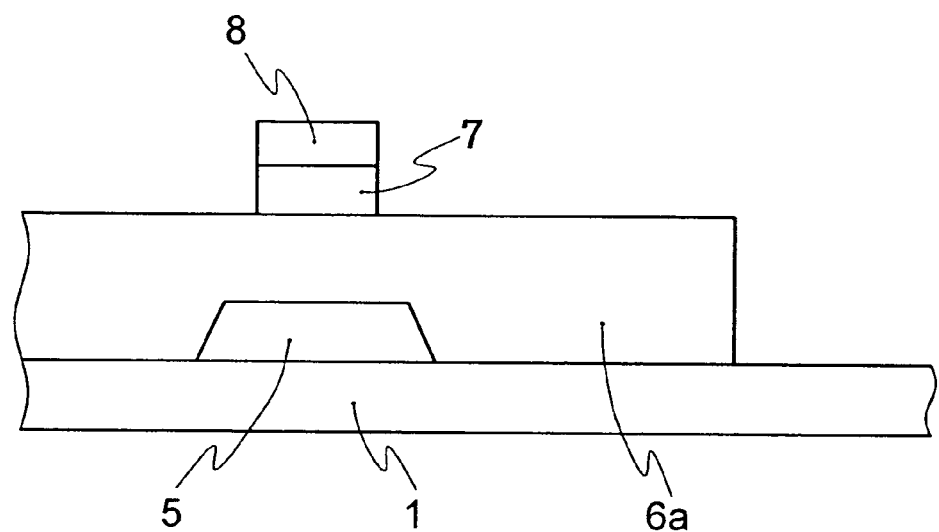
FIG. 19 is a sectional view showing the process for manufacturing a TFT array substrate according to the fourth Embodiment of the present invention.
Figure 19B:
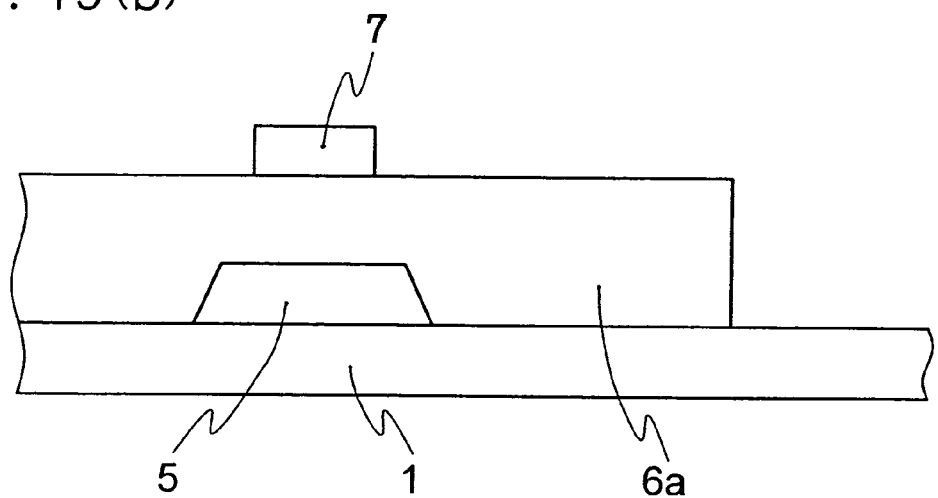
Figure 20A:
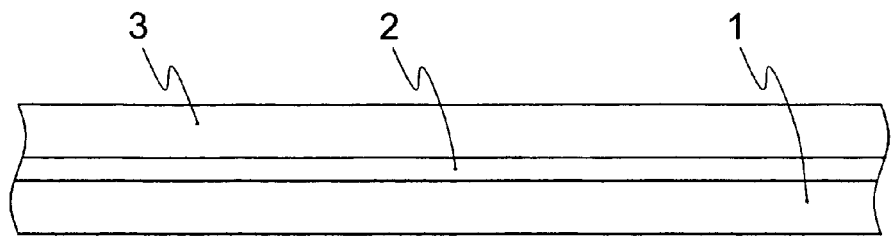
FIG. 20 is a sectional view illustrating a photolithographic step.
Figure 20B:
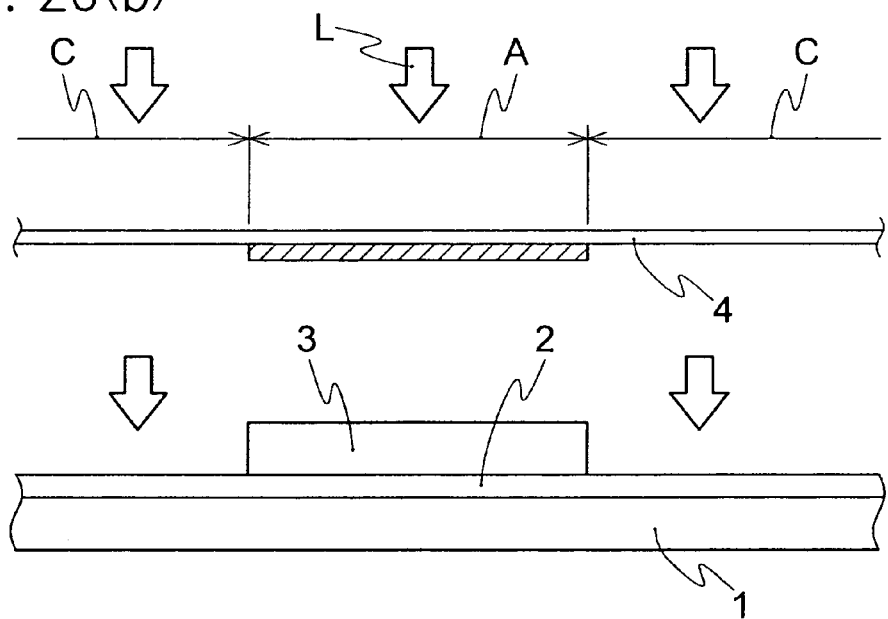
Figure 20C:
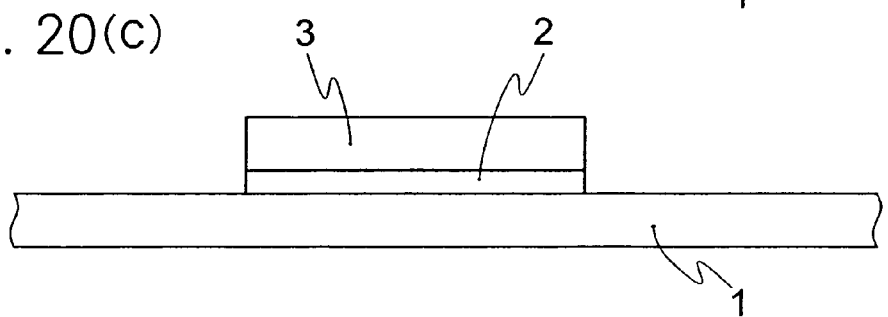
Figure 20D:
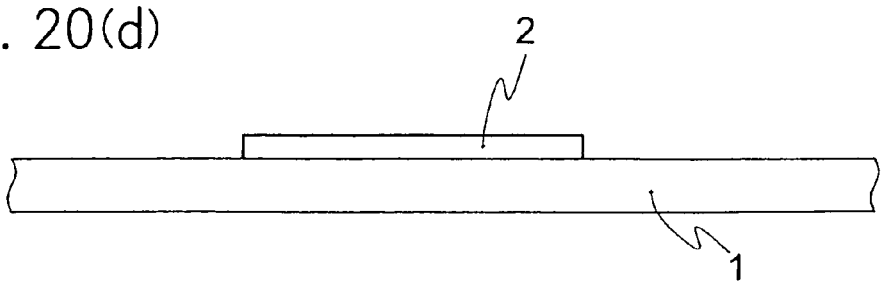
Figure 21:
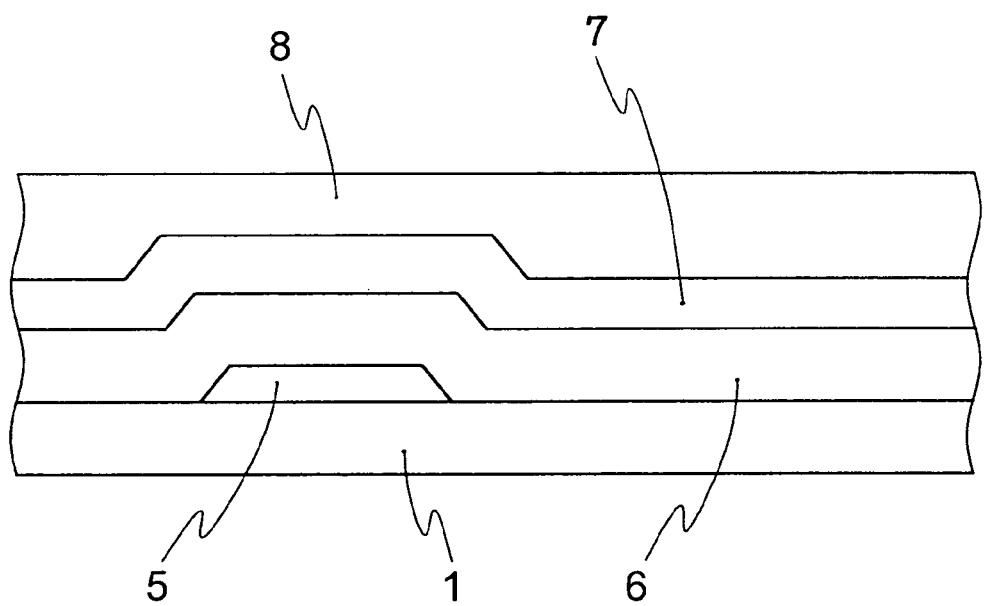
FIG. 21 is a sectional view showing a conventional patterning method.
Figure 22A:
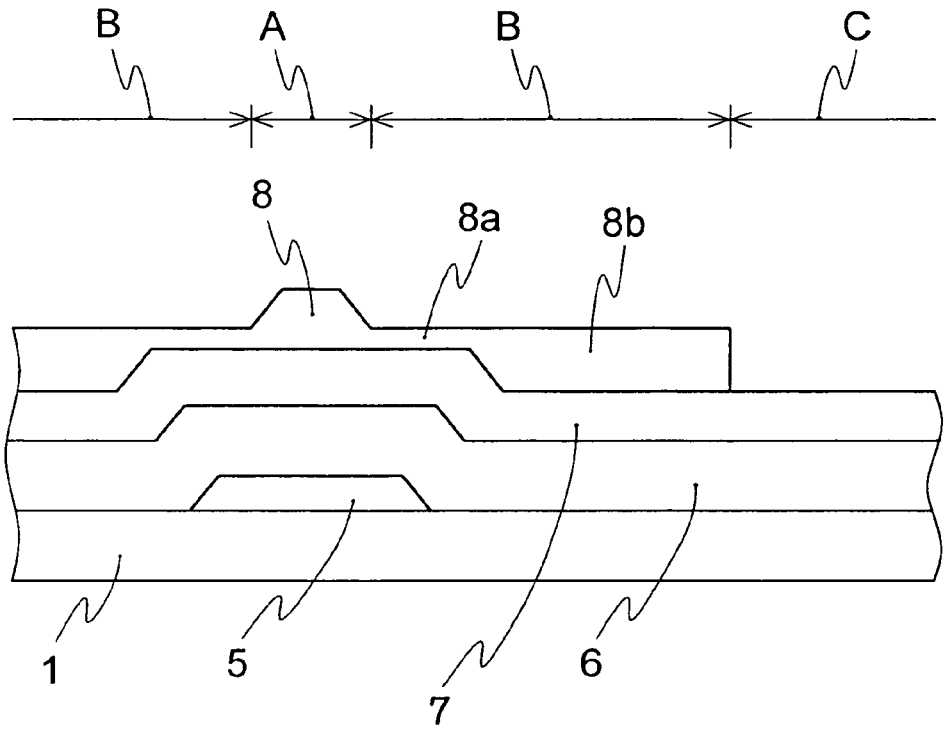
FIG. 22 is a sectional view showing the conventional patterning method.
Figure 22B:
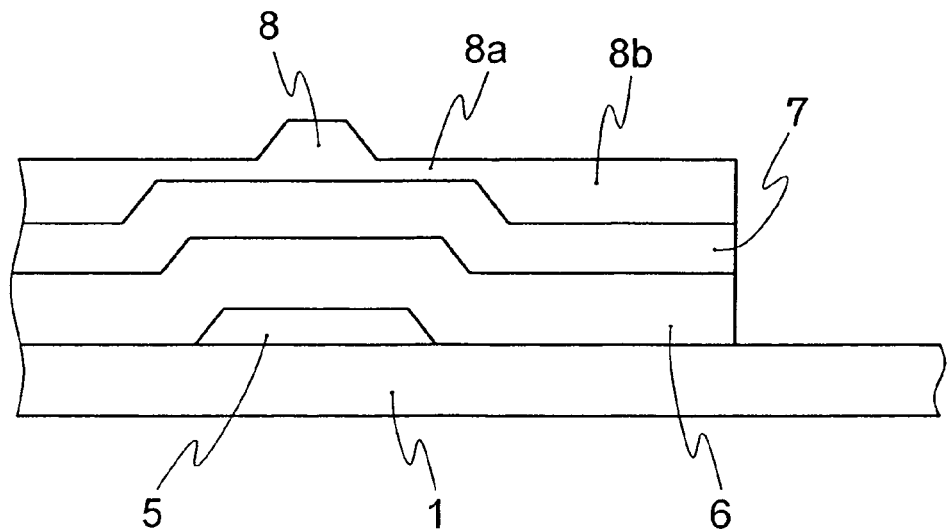
Figure 23A:
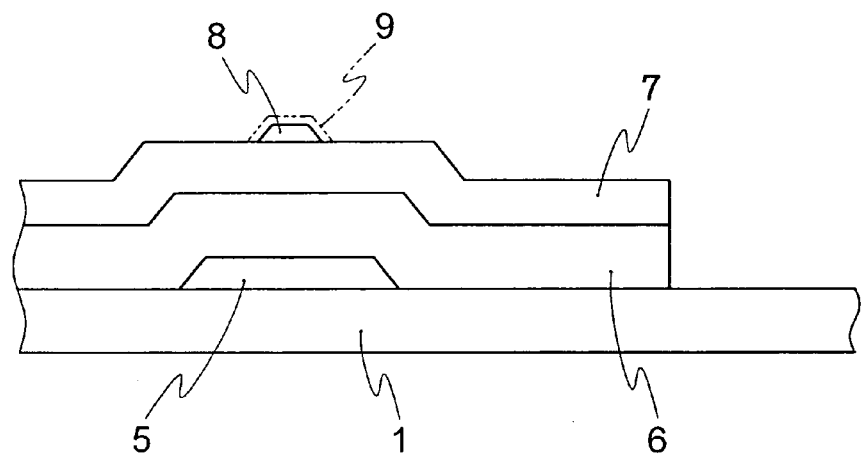
FIG. 23 is a sectional view showing the conventional patterning method.
Figure 23B:
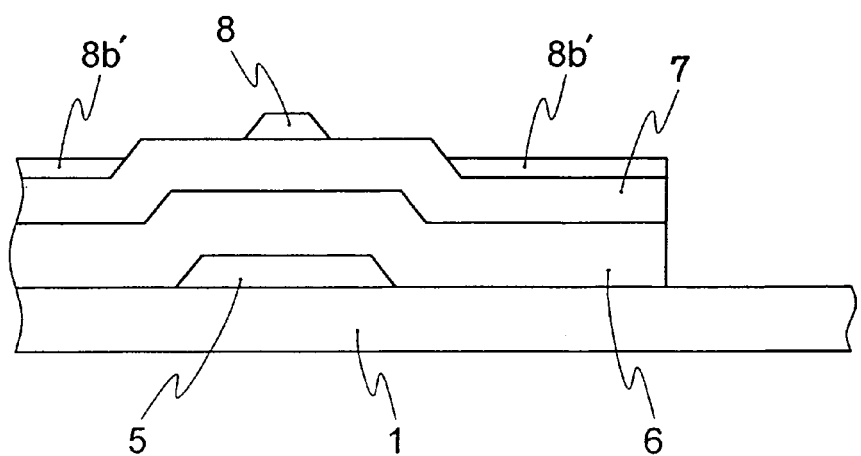

Then, a halftone resist 10 is removed by ashing (FIG. 18(b)), the second film to be etched 7 is etched with the residual resist 8 (FIG. 19(a)) and the resist 8 is finally removed (FIG. 19(b)). At a one-time photolithographic step, two layers of the first film to be etched 6 and the second film to be etched 7 can be patterned to have different patterns, respectively.

As described above, according to the present Embodiment, the first film to be etched 6a is used as a flattened film and the thickness of the resist 8 obtained immediately after the application (before the exposure and the development) is made constant. Consequently, it is possible to cause the halftone resist obtained after the exposure and the development to have a constant thickness irrespective of the presence of the substrate film and to carry out the patterning over the etched film with high precision without using the photomask having plural kinds of partially transparent portions according to the first or second Embodiment.

INDUSTRIAL APPLICABILITY

According to the present invention, there can be obtained a thin film patterning method capable of forming the thickness of the halftone resist almost uniformly in the halftone portion provided around the step formed by the substrate film.

According to the invention in accordance with the third or fourth Embodiment of the present invention, moreover, it is possible to obtain a thin film patterning method capable of forming the thickness of the halftone resist almost uniformly also in a conventional photomask having a single amount of light irradiation on the resist in the halftone portion.

According to the present invention, furthermore, it is possible to decrease one photolithographic step by using the halftone exposure and to form the pattern of the TFT array substrate with high precision. Consequently, it is possible to implement the TFT array substrate at a low cost and to realize a reduction in the cost and an increase in production.

The invention claimed is:

1. A thin film patterning method comprising steps of: forming a pattern of an under layer on a substrate; forming at least two films to be etched; applying a resist on the films to be etched; exposing the resist by using a photomask having a transmitting portion C, a shielding portion A, a first partially transparent portion B1 in a region where the under layer is present and having a first partially transmitting light amount, and a second partially transparent portion B2 in a region where the under layer is not present and having a second transmitting light amount larger than the first transmitting light amount; developing the resist thus exposed to obtain at least three kinds of regions, namely a region in which the resist has a thickness of almost 0 (zero), a region in which the resist has a great thickness, and a region in which the resist has an intermediate thickness; and etching the films while carrying out ashing over the resist, wherein an amount of light transmission during the exposure in the region in which the under layer is present is smaller than an amount of light transmission during the exposure in the region in which the under layer is not present and in the region in which the resist has the intermediate thickness.

2. A TFT array substrate comprising: a transparent conductive layer; a metal layer formed on the transparent conductive layer; a gate insulating film; and a semiconductor layer on a substrate; said TFT substrate further comprising a gate electrode/wiring formed of the transparent conductive layer and the metal layer by etching the transparent conductive layer and the metal layer, and a pixel electrode formed of the transparent conductive layer; wherein at least said gate insulating film, said semiconductor layer and said metal layer are partially removed in a portion provided on the pixel electrode through which light is transmitted; and wherein said semiconductor layer is almost flattened by said gate insulating film.

3. A method of manufacturing a TFT array substrate comprising steps of: forming a transparent conductive layer on a substrate; forming a first metal layer on the transparent conductive layer; etching the transparent conductive layer and the metal layer to form a gate electrode/wiring and a pixel electrode; forming a gate insulating film and a semiconductor layer; etching the gate insulating film and the semiconductor layer to expose the pixel electrode; removing a first metal layer of the pixel electrode so as to be exposed; and forming a second metal layer and carrying out etching to form a source electrode and a drain electrode, wherein the gate insulating film is formed to have such a thickness as to absorb a step provided by the gate electrode/wiring.

4. A method of manufacturing a TFT array substrate comprising steps of: forming a transparent conductive layer on a substrate; forming a first metal layer on the transparent conductive layer; etching the transparent conductive layer and the metal layer to form a gate electrode/wiring and a pixel electrode; forming a gate insulating film and a semiconductor layer; applying a resist on the gate insulating film and the semiconductor layer; exposing and developing the resist, thereby forming a region A where the resist is made thick to leave the semiconductor layer, a region C where the resist is removed to eliminate the semiconductor layer, the gate insulating film and the first metal layer in at least a portion on the pixel electrode through which light is transmitted, and a region B where the thickness of the resist is made smaller than that of the resist formed in the region A in order to remove the semiconductor layer; etching the semiconductor layer and the gate insulating film to expose the pixel electrode by using the resist forming the regions A, B and C; removing the first metal layer to be an upper layer of the pixel electrode thus exposed, a step of removing the resist from the region B while leaving the resist in the region A; removing the semiconductor layer in a portion other than the region A; peeling the resist in the region A; and forming a second metal layer and carrying out etching to form a source electrode and a drain electrode; wherein the gate insulating film is formed to have such a thickness as to absorb a step provided by the gate electrode/wiring.

* * * * *

UNITED STATES PATENT AND TRADEMARK OFFICE
CERTIFICATE OF CORRECTION

| | |
|---|---|
| PATENT NO. | : 7,157,319 B2 |
| APPLICATION NO. | : 10/381865 |
| DATED | : January 2, 2007 |
| INVENTOR(S) | : Ishikawa et al. |

It is certified that error appears in the above-identified patent and that said Letters Patent is hereby corrected as shown below:

On title page Item [54]
Please delete the title and substitute the following therefor: --THIN FILM PATTERNING METHOD, TFT ARRAY SUBSTRATE USING THE SAME, AND MANUFACTURING METHOD THEREOF--.

In abstract, line 9, "base film-present" should be --base-film-present--.

In column 1 line 5-6 after the title and prior to "TECHNICAL FIELD," please insert the following sentence: --This application is a §371 of International Application PCT/JP01/05827 filed 05 July 2001.--

In column 1 at line 22, please delete "and a" and substitute therefor --so the--.

In column 1 at line 22, please delete "step is" and substitute therefor --process becomes--.

In column 1 at line 28, please delete "in order to" and substitute therefor --during--.

In column 1 at line 28, please delete "the" and substitute therefor --of a--.

In column 1 at line 31, after "film" please insert --2--.

In column 1 at line 31, after "etched" please delete "2" and substitute therefor --,--.

In column 1 at line 32, after "like" please insert --,--.

In column 1 at line 37, please delete "illuminate" and substitute therefor --apply--.

In column 1 at line 42, please delete "lost" and substitute therefor --removed--.

UNITED STATES PATENT AND TRADEMARK OFFICE
CERTIFICATE OF CORRECTION

PATENT NO. : 7,157,319 B2
APPLICATION NO. : 10/381865
DATED : January 2, 2007
INVENTOR(S) : Ishikawa et al.

It is certified that error appears in the above-identified patent and that said Letters Patent is hereby corrected as shown below:

In column 2, line 4, "is required to" should be --must--.

In column 2, line 13, after "10-163174", --,Nishiki et al.-- should be inserted.

In column 2, line 21, after "ashing", --(oxidation)-- should be inserted.

In column 2, line 38, "Disclosure of Invention" should be --Summary of the Invention--.

In column 2, line 40, "At" should be --In--.

In column 2, line 45, after ")", --,-- should be inserted.

In column 2, line 46, "in" should be --by--.

In column 2, line 49, "varied for" should be --subject to variation, due to--.

In column 2, line 50, "factor of" should be --factors causing--.

In column 2, line 56, "resulted" should be --resulting--.

In column 2, line 58, after "etched", --,-- should be inserted.

In column 2, line 59, "same" should be --layers--.

In column 3, line 1, "description" should be --the following explanation--.

In column 3, line 2, "on" should be --as to--.

In column 3, line 2, "for which" should be --why--.

In column 3, line 3, after ")", --,-- should be inserted.

UNITED STATES PATENT AND TRADEMARK OFFICE
CERTIFICATE OF CORRECTION

| | |
|---|---|
| PATENT NO. | : 7,157,319 B2 |
| APPLICATION NO. | : 10/381865 |
| DATED | : January 2, 2007 |
| INVENTOR(S) | : Ishikawa et al. |

It is certified that error appears in the above-identified patent and that said Letters Patent is hereby corrected as shown below:

In column 12, line 3, "tickness" should be --thickness--.

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

| | |
|---|---|
| PATENT NO. | : 7,157,319 B2 |
| APPLICATION NO. | : 10/381865 |
| DATED | : January 2, 2007 |
| INVENTOR(S) | : Ishikawa et al. |

It is certified that error appears in the above-identified patent and that said Letters Patent is hereby corrected as shown below:

On title page Item [54] and Column 1, lines 1-4
Please delete the title and substitute the following therefor: --THIN FILM PATTERNING METHOD, TFT ARRAY SUBSTRATE USING THE SAME, AND MANUFACTURING METHOD THEREOF--.

In abstract, line 9, "base film-present" should be --base-film-present--.

In column 1 line 5-6 after the title and prior to "TECHNICAL FIELD," please insert the following sentence: --This application is a §371 of International Application PCT/JP01/05827 filed 05 July 2001.--

In column 1 at line 22, please delete "and a" and substitute therefor --so the--.

In column 1 at line 22, please delete "step is" and substitute therefor --process becomes--.

In column 1 at line 28, please delete "in order to" and substitute therefor --during--.

In column 1 at line 28, please delete "the" and substitute therefor --of a--.

In column 1 at line 31, after "film" please insert --2--.

In column 1 at line 31, after "etched" please delete "2" and substitute therefor --,--.

In column 1 at line 32, after "like" please insert --,--.

In column 1 at line 37, please delete "illuminate" and substitute therefor --apply--.

In column 1 at line 42, please delete "lost" and substitute therefor --removed--.

UNITED STATES PATENT AND TRADEMARK OFFICE
CERTIFICATE OF CORRECTION

PATENT NO.         : 7,157,319 B2
APPLICATION NO. : 10/381865
DATED              : January 2, 2007
INVENTOR(S)        : Ishikawa et al.

It is certified that error appears in the above-identified patent and that said Letters Patent is hereby corrected as shown below:

In column 2, line 4, "is required to" should be --must--.

In column 2, line 13, after "10-163174", --,Nishiki et al.-- should be inserted.

In column 2, line 21, after "ashing", --(oxidation)-- should be inserted.

In column 2, line 38, "Disclosure of Invention" should be --Summary of the Invention--.

In column 2, line 40, "At" should be --In--.

In column 2, line 45, after ")", --,-- should be inserted.

In column 2, line 46, "in" should be --by--.

In column 2, line 49, "varied for" should be --subject to variation, due to--.

In column 2, line 50, "factor of" should be --factors causing--.

In column 2, line 56, "resulted" should be --resulting--.

In column 2, line 58, after "etched", --,-- should be inserted.

In column 2, line 59, "same" should be --layers--.

In column 3, line 1, "description" should be --the following explanation--.

In column 3, line 2, "on" should be --as to--.

In column 3, line 2, "for which" should be --why--.

In column 3, line 3, after ")", --,-- should be inserted.

UNITED STATES PATENT AND TRADEMARK OFFICE
CERTIFICATE OF CORRECTION

PATENT NO. : 7,157,319 B2
APPLICATION NO. : 10/381865
DATED : January 2, 2007
INVENTOR(S) : Ishikawa et al.

It is certified that error appears in the above-identified patent and that said Letters Patent is hereby corrected as shown below:

In column 12, line 3, "tickness" should be --thickness--.

This certificate supersedes the Certificate of Correction issued May 20, 2008.

Signed and Sealed this

Seventeenth Day of June, 2008

JON W. DUDAS
*Director of the United States Patent and Trademark Office*